US009654772B2

(12) United States Patent
Guo et al.

(10) Patent No.: US 9,654,772 B2
(45) Date of Patent: May 16, 2017

(54) CONTEXT ADAPTIVE ENTROPY CODING WITH A REDUCED INITIALIZATION VALUE SET

(71) Applicant: Qualcomm Incorporated, San Diego, CA (US)

(72) Inventors: Liwei Guo, San Diego, CA (US); Muhammed Zeyd Coban, Carlsbad, CA (US); Xianglin Wang, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 558 days.

(21) Appl. No.: 13/744,087

(22) Filed: Jan. 17, 2013

(65) Prior Publication Data

US 2013/0188700 A1 Jul. 25, 2013

Related U.S. Application Data

(60) Provisional application No. 61/588,604, filed on Jan. 19, 2012, provisional application No. 61/588,626, filed on Jan. 19, 2012.

(51) Int. Cl.
*H04N 7/12* (2006.01)
*H04N 19/50* (2014.01)
(Continued)

(52) U.S. Cl.
CPC .... *H04N 19/00569* (2013.01); *H03M 7/4018* (2013.01); *H04N 19/13* (2014.11);
(Continued)

(58) Field of Classification Search
CPC ........ H04N 19/13; H04N 19/70; H04N 19/61; H04N 19/174; H04N 19/436; H04N 19/44;
(Continued)

(56) References Cited

U.S. PATENT DOCUMENTS 6,894,628 B2 5/2005 Marpe et al.
7,190,289 B2 3/2007 Kobayashi et al.
(Continued)

FOREIGN PATENT DOCUMENTS

CN 1656817 A 8/2005
JP 2006279333 A 10/2006
(Continued)

OTHER PUBLICATIONS

Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
(Continued)

*Primary Examiner* — Gims Philippe

(57) ABSTRACT

Techniques for coding data, such as, e.g., video data, include coding a first syntax element, conforming to a particular type of syntax element, of a first slice of video data, conforming to a first slice type, using an initialization value set. The techniques further include coding a second syntax element, conforming to the same type of syntax element, of a second slice of video data, conforming to a second slice type, using the same initialization value set. In this example, the first slice type may be different from the second slice type. Also in this example, at least one of the first slice type and the second slice type may be a temporally predicted slice type. For example, the at least one of the first and second slice types may be a unidirectional inter-prediction (P) slice type, or a bi-directional inter-prediction (B) slice type.

39 Claims, 7 Drawing Sheets

(51) Int. Cl.
  *H03M 7/40* (2006.01)
  *H04N 19/13* (2014.01)
  *H04N 19/60* (2014.01)
  *H04N 19/91* (2014.01)
  *H04N 19/21* (2014.01)
(52) U.S. Cl.
  CPC ............ *H04N 19/21* (2014.11); *H04N 19/50* (2014.11); *H04N 19/60* (2014.11); *H04N 19/91* (2014.11)
(58) Field of Classification Search
  CPC .... H04N 19/91; H04N 19/176; H04N 19/513; H04N 19/55; H04N 19/63; H04N 19/00793
  USPC ........................................ 375/240.01–240.29
  See application file for complete search history.

(56) References Cited

U.S. PATENT DOCUMENTS

| | | | |
|---|---|---|---|
| 7,777,654 B2 | 8/2010 | Chang | |
| 7,920,629 B2 | 4/2011 | Bjontegaard et al. | |
| 7,929,776 B2 | 4/2011 | Sethi et al. | |
| 2005/0012648 A1* | 1/2005 | Marpe ................. | H03M 7/4006 341/107 |
| 2007/0009047 A1* | 1/2007 | Shim ..................... | H04N 19/70 375/240.26 |
| 2010/0098155 A1* | 4/2010 | Demircin ............ | H03M 7/4006 375/240.02 |
| 2012/0082218 A1 | 4/2012 | Misra et al. | |
| 2012/0082232 A1 | 4/2012 | Sole Rojals et al. | |
| 2013/0077687 A1* | 3/2013 | Wang ................... | H04N 19/105 375/240.15 |

FOREIGN PATENT DOCUMENTS

| | | |
|---|---|---|
| JP | 2007074337 A | 3/2007 |
| JP | 2010171655 A | 8/2010 |
| WO | 2006099224 A1 | 9/2006 |
| WO | 2011128268 A1 | 10/2011 |

OTHER PUBLICATIONS

ITU-T H.265, Series H: Audiovisual and Multimedia Systems, Infrastructure of audiovisual services—Coding of moving video, Advanced video coding for generic audiovisual services, The International Telecommunication Union. Oct. 2014, 540 pp.
International Preliminary Report on Patentability from International Application No. PCT/US2013/022138, dated May 13, 2014, 7 pp.
Response to Second Written Opinion dated Mar. 22, 2013, from International Application No. PCT/US2013/022138, filed on Nov. 18, 2013, 38 pp.
Bross et al., "High efficiency video coding (HEVC) text specification draft 6," Joint Collaborative Team on Video Coding, JCTVC-H1003, Nov. 21-30, 2011, 259 pp.
Bross et al., "High efficiency video coding (HEVC) text specification draft 7," Joint Collaborative Team on Video Coding, JCTVC-I1003_D2, Apr. 27-May 7, 2012, 290 pp.
Bross et al., "High efficiency video coding (HEVC) text specification draft 8," Joint Collaborative Team on Video Coding, JCTVC-J1003_D7, Jul. 11-20, 2012, 261 pp.
Bross et al., "WD4: Working Draft 4 of High-Efficiency Video Coding," Joint Collaborative Team on Video Coding, JCTVC-F803_d2, Jul. 14-22, 2011, 226 pp.
Bross et al., "WD5: Working Draft 5 of High-Efficiency Video Coding," Joint Collaborative Team on Video Coding, JCTVC-G1103_d2, Nov. 21-30, 2011, 214 pp.

International Search Report and Written Opinion—PCT/US2013/022138—ISA/EPO—Mar. 22, 2013—18 pp.
International Telecommunication Union, "Advanced video coding for generic audiovisual services," Standardization Sector of ITU, Jun. 2011, 674 pp.
Marpe et al.,"Final CABAC Cleanup", Joint Video Team, JVT-F039r1, Dec. 5-13, 2002, 24 pp.
Schwarz et al., "CABAC and Slices", Joint Video Team, No. JVT-E154, Oct. 19-17, 2002, 18 pp.
Wiegand, "Editors Proposed Changes Relative to JVT-E146d37ncm, revision 2", Joint Video Team, JVT-F082r2, Dec. 5-13, 2002, 245 pp.
Wiegand et al., "WD2: Working Draft 2 of High-Efficiency Video Coding", Joint Collaborative Team on Video Coding, JCTVC-D503, Jan. 20-28, 2011, 153 pp.
Wiegand et al., "WD3: Working Draft 3 of High-Efficiency Video Coding," Joint Collaborative Team on Video Coding, JCTVC-E603, Mar. 16-23, 2011,193 pp.
Wiegand et al.," WD1: Working Draft 1 of High-Efficiency Video Coding", Joint Collaborative Team on Video Coding, JCTVC-C403, Oct. 7-15, 2010, 137 pp.
Bossen F., "Common test conditions and software reference configurations," 7th Meeting: Nov. 21-30, 2011, Geneva, CH, Joint Collaborative Team on Video Coding (JCT-VC) of ITU-T SG16 WP3 and ISO/IEC JTC1/SC29/WG11, Document: JCTVC-G1200, WG11 No. m22869, 2011, 4 pages.
Guo L., et al., "On CABAC Initialization," Joint Collaborative Team on Video Coding (JCT-VC) of ITU-T SG16 WP3 and ISO/IEC JTC1/SC29/WG11, 8th Meeting: San Jose, CA, USA, Feb. 1-10, 2012, Document JCTVC-H0561, pp. 1-8.
Misra K., et al., "Cei subtest B4—on CABAC Init IDC," Joint Collaborative Team on Video Coding (JCT-VC) of ITU-T SG16 WP3 and ISO/IEC JTC1/SC29/WG11, 8th Meeting: San Jose, CA, USA, Feb. 1-10, 2012, Document JCTVC-H0540, pp. 1-9.
Bross., B., et aL, "WD4: Working Draft 4 of High-Efficiency Video Coding, Joint Collaborative Team on Video Coding (JCT-VC) of ITU-T SG16 WP3 and ISO/IEC JTC1/SC29/WG11," 6th Meeting: Torino, IT, Oct. 2011, JCTVC-F803_d5, pp. i, 169-180, http://phenix.it-sudparis.eu/jct/doc_end_user/sdocuments/6_Torino/wg11/JCTVC-F803-v7.zip.
Guo L., et al., "Non-Ce1: 8-bit Initialization for CABAC," Joint Collaborative Team on Video Coding (JCT-VC) of ITU-T SG16 WP3 and ISO/IEC JTC1/SC29/WG11, 7th Meeting: Geneva, Nov. 2011, JCTVC-G837_r3, pp. 1-7.
Marpe, D., et al., "Unified PIPE-Based Entropy Coding for HEVC",6. JCT-VC Meeting; 97. MPEG Meeting; Jul. 14-22, 2011; Torino; (Joint Collaborative Team on Video Coding of ISO/IEC JTC1/SC29/WG11 and ITU-T SG.16); URL:http://wftp3.itu.int/av-arch/jctvc-site/, No. JCTVC-F268, Jul. 15, 2011 (Jul. 15, 2011), XP030009291, 16 pp.
Misra K., et al., "Improved CABAC Context Initialization," Joint Collaborative Team on Video Coding (JCT-VC) of ITU-T SG16 WP3 and ISO/IEC JTC1/SC29/WG11, 6th Meeting: Torino, IT, Jul. 2011, JCTVC-F593_rl, pp. 1-3.
Misra K., et al., "On CABAC Init IDC," Joint Collaborative Team on Video Coding (JCT-VC) of ITU-T SG16 WP3 and ISO/IEC JTC1/SC29/WG11, 7th Meeting: Geneva, CH, Nov. 2011, JCTVC-G716, pp. 1-7.
Yeo C., et aL, "Non-Cej: on CABAC context initialization," Joint Collaborative Team on Video Coding (JCT-VC) of ITU-T SG16 WP3 and ISO/IEC JTC1/SC29/WG11, 7th Meeting: Geneva, CH, Nov. 2011, JCTVC-G155, pp. 1-11.
Japanese First Office Action from corresponding Japanese Application Serial No. 2014-553452 dated Dec. 6, 2016 having including translation (18 pp).

* cited by examiner

CONTEXT ADAPTIVE ENTROPY CODING WITH A REDUCED INITIALIZATION VALUE SET

This application claims the benefit of U.S. Provisional Application No. 61/588,604, filed Jan. 19, 2012, and U.S. Provisional Application No. 61/588,626, filed Jan. 19, 2012, the entire contents of each of which are incorporated herein by reference.

TECHNICAL FIELD

This disclosure relates to video coding, and, more particularly, to entropy coding slices of video data generated by video coding processes.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients. Entropy coding may then be applied to achieve even more compression.

SUMMARY

As one example, the techniques of this disclosure include determining initial context states, corresponding to initial probabilities, for one or more contexts used to code video data as part of performing a context adaptive entropy coding process. In some examples, the context adaptive entropy coding process may be a context adaptive binary arithmetic coding (CABAC) process. For example, the disclosed techniques may include determining the initial context states for the one or more contexts based on initialization values for the contexts. In particular, in this example, the initialization values, or an initialization value "set" thereof, for the one or more contexts may be selected based on a slice type associated with the video data. For example, the slice type associated with the video data may include any of a variety of slice types (e.g., any of an intra-prediction (I) slice type, a unidirectional inter-prediction (P) slice type, and a bi-directional inter-prediction (B) slice type, as some examples). Furthermore, also in this example, the same initialization value set may be selected when the slice type associated with the video data is any one of two or more of the above-described slice types. As a result, the number of initialization value sets used to code syntax elements of slices having different slice types may be reduced, compared to other techniques.

In one example of this disclosure, a method of coding video data includes coding a first syntax element, conforming to a particular type of syntax element, of a first slice of video data, conforming to a first slice type, using an initialization value set. The method further includes coding a second syntax element, conforming to the particular type of syntax element, of a second slice of video data, conforming to a second slice type, using the initialization value set. In this example, the first slice type is different from the second slice type. Also in this example, at least one of the first slice type and the second slice type is a temporally predicted slice type.

In another example of this disclosure, an apparatus configured to code video data includes a video coder. In this example, the video coder is configured to code a first syntax element, conforming to a particular type of syntax element, of a first slice of video data, conforming to a first slice type, using an initialization value set. The video coder is further configured to code a second syntax element, conforming to the particular type of syntax element, of a second slice of video data, conforming to a second slice type, using the initialization value set. In this example, the first slice type is different from the second slice type. Also in this example, at least one of the first slice type and the second slice type is a temporally predicted slice type.

In another example of the disclosure, a device configured to code video data includes means for coding a first syntax element, conforming to a particular type of syntax element, of a first slice of video data, conforming to a first slice type, using an initialization value set. The device further includes means for coding a second syntax element, conforming to the particular type of syntax element, of a second slice of video data, conforming to a second slice type, using the initialization value set. In this example, the first slice type is different from the second slice type. Also in this example, at least one of the first slice type and the second slice type is a temporally predicted slice type.

The techniques described in this disclosure may be implemented in hardware, software, firmware, or combinations thereof. If implemented in hardware, an apparatus may be realized as an integrated circuit, a processor, discrete logic, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a tangible computer-readable medium and loaded and executed in the processor.

In another example, a computer-readable storage medium stores instructions that, when executed, cause one or more processors to code video data. In this example, the instructions cause the one or more processors to code a first syntax element, conforming to a particular type of syntax element, of a first slice of video data, conforming to a first slice type, using an initialization value set. The computer-readable storage medium further comprises instructions that cause the one or more processors to code a second syntax element, conforming to the particular type of syntax element, of a second slice of video data, conforming to a second slice type, using the initialization value set. In this example, the first slice type is different from the second slice type. Also in this example, at least one of the first slice type and the second slice type is a temporally predicted slice type.

The details of one or more examples are set forth in the accompanying drawings and the description below. Other features, objects, and advantages will be apparent from the description and drawings, and from the claims.

DETAILED DESCRIPTION

Figure 1:
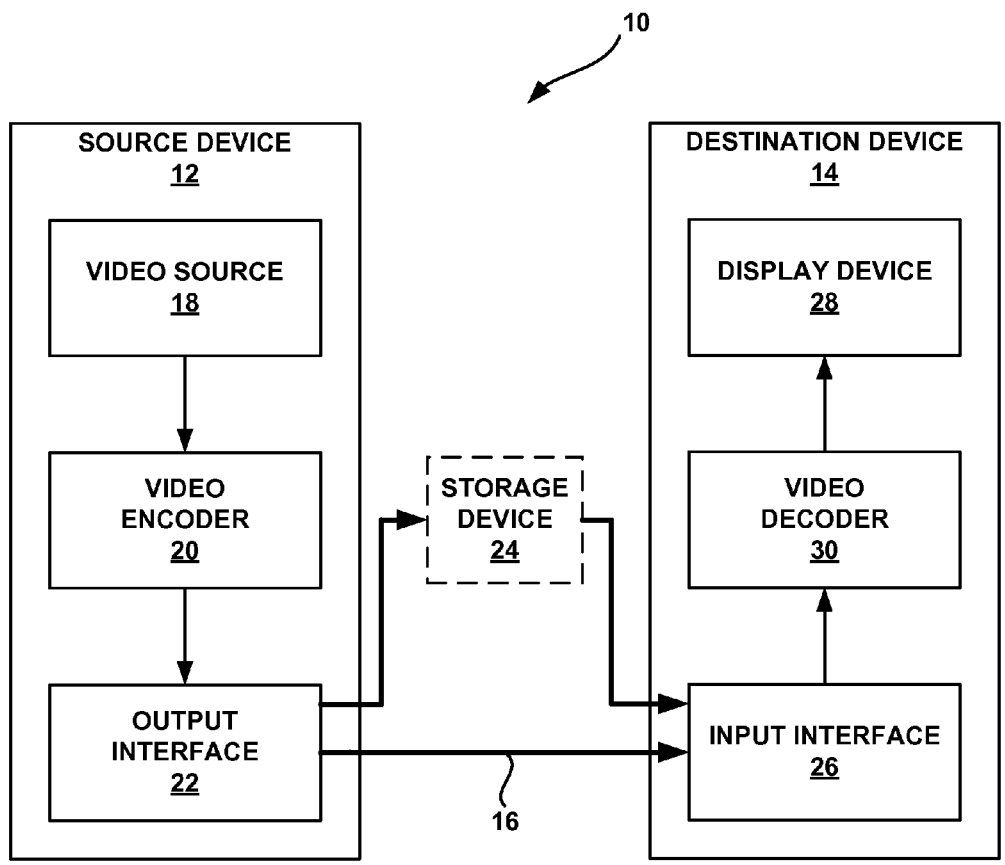
FIG. 1 is a block diagram that illustrates an example of a video encoding and decoding system that may perform techniques for context adaptive entropy coding with a reduced initialization value set, consistent with the techniques of this disclosure.

In general, the techniques of this disclosure relate to context-adaptive binary arithmetic coding (CABAC). CABAC generally includes coding syntax elements of a video unit, e.g., a slice of video data. CABAC techniques may be considered "context-adaptive" in the sense that the context used to code a particular type of syntax element may change (that is, adapt) based on historical coding actions, e.g., coding of previous syntax elements of the same type.

The techniques of this disclosure are generally directed to initialization of contexts for the various types of syntax elements.

As one example, the techniques disclosed herein include determining initial context states, corresponding to initial probabilities, for one or more contexts used to code various types of syntax elements of video data as part of performing a context adaptive entropy coding process, such as CABAC. For example, the disclosed techniques may include determining the initial context states for the one or more contexts based on initialization values for the contexts. In particular, in this example, the initialization values, or an initialization value "set" thereof, for the one or more contexts may be selected based on a slice type associated with the video data. For example, the slice type associated with the video data may include any of a variety of slice types (e.g., any of an intra-prediction (I) slice type, a unidirectional inter-prediction (P) slice type, and a bi-directional inter-prediction (B) slice type, as some examples). Furthermore, the same initialization value set may be selected for two or more of the above-described slice types. As a result, the number of initialization value sets used to code syntax elements of slices having different slice types may be reduced, compared to other techniques.

In other words, rather than assigning individual initialization value sets to each type of slice, the techniques of this disclosure include assigning the same initialization value set to two or more types of slices. For example, the same initialization value set may be assigned to I-slice types and P-slice types. As another example, the same initialization value set may be assigned to I-slice types and B-slice types. As still another example, the same initialization value set may be assigned to P-slice types and B-slice types. In this manner, the same initialization value set may be assigned to two different slice types, at least one of which is an inter-predicted slice type, also referred to as a temporally predicted slice type. Inter-predicted, or temporally predicted, slice types include P-slice types and B-slice types.

As another example, the techniques further include, for each slice of video data coded using the same initialization value set in the manner described above, determining the initial context states for the one or more contexts based at least in part on a slice type associated with the respective slice. As a result, accuracy of initial probabilities indicated by the initial context states may be improved compared to other techniques.

As still another example, the disclosed techniques include adaptively selecting an initialization value set for determining initial context states for one or more contexts of a context adaptive entropy coding process used to code video data. In particular, in this example, an initialization value set for one or more contexts used to code a slice of video data may be indicated using an initialization indicator value associated the slice, rather than, e.g., a slice type associated with the slice. In some cases, a video coder may code the same initialization indicator value for each of multiple slices of video data having different slice types, resulting in using the same initialization value set to code one or more syntax elements of each slice (hence, multiple slices of different slice types, which may include at least one inter-predicted slice).

Alternatively, as still another example, initialization indicator values for multiple slices of video data having different slice types may be different initialization indicator values, resulting in using different initialization value sets to code one or more syntax elements of each slice. In this example, the disclosed techniques include determining the initial context states for the one or more contexts based on the different initialization indicator values for each slice, rather than a slice type associated with the respective slice. As a result, accuracy of initial probabilities indicated by the initial context states may be improved compared to other techniques.

Accordingly, the disclosed techniques may, in some cases, enable coding video data (e.g., quantized transformed residual coefficient values, or other syntax information, for one or more blocks of video data) more efficiently. For example, the techniques may enable coding the video data using coding systems that have lower complexity compared to other systems, e.g., systems that store different context initialization values, or "initialization value sets," for contexts for each slice type. Additionally, the techniques may enable coding the video data using fewer bits than when using other techniques to code similar data, e.g., techniques that include determining initial context states used to code video data without considering slice type information associated with the video data, or that do not allow adaptively determining the initial context states irrespective of the slice type information. In particular, using the disclosed techniques may result in initializing one or more contexts of a context adaptive entropy coding process such that the contexts include relatively more accurate probability estimates, compared to contexts initialized using other techniques. In this manner, there may be a relative reduction in complexity of a coding system used to code video data, and/or a relative bit savings for a coded bitstream that includes the coded video data, when using the techniques of this disclosure.

FIG. 1 is a block diagram that illustrates an example of a video encoding and decoding system that may perform techniques for context adaptive entropy coding with a reduced initialization value set, consistent with the techniques of this disclosure. As shown in FIG. 1, system 10 includes a source device 12 that generates encoded video data to be decoded at a later time by a destination device 14. Source device 12 and destination device 14 may comprise any of a wide range of devices, including desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming devices, or the like. In some cases, source device 12 and destination device 14 may be equipped for wireless communication.

Destination device 14 may receive the encoded video data to be decoded via a link 16. Link 16 may comprise any type of medium or device capable of moving the encoded video data from source device 12 to destination device 14. In one example, link 16 may comprise a communication medium to enable source device 12 to transmit encoded video data directly to destination device 14 in real-time. The encoded video data may be modulated according to a communication standard, such as a wireless communication protocol, and transmitted to destination device 14. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

Alternatively, encoded data may be output from output interface 22 to a storage device 24. Similarly, encoded data may be accessed from storage device 24 by input interface 26. Storage device 24 may include any of a variety of distributed or locally accessed data storage media such as a hard drive, Blu-ray discs, DVDs, CD-ROMs, flash memory, volatile or non-volatile memory, or any other suitable digital storage media for storing encoded video data. In a further example, storage device 24 may correspond to a file server or another intermediate storage device that may hold the encoded video generated by source device 12. Destination device 14 may access stored video data from storage device 24 via streaming or download. The file server may be any type of server capable of storing encoded video data and transmitting that encoded video data to the destination device 14. Example file servers include a web server (e.g., for a website), an FTP server, network attached storage (NAS) devices, or a local disk drive. Destination device 14 may access the encoded video data through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server. The transmission of encoded video data from storage device 24 may be a streaming transmission, a download transmission, or a combination of both.

The techniques of this disclosure are not necessarily limited to wireless applications or settings. The techniques may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes a video source 18, video encoder 20 and an output interface 22. In some cases, output interface 22 may include a modulator/demodulator (modem) and/or a transmitter. In source device 12, video source 18 may include a source such as a video capture device, e.g., a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications.

The captured, pre-captured, or computer-generated video may be encoded by video encoder 20. The encoded video data may be transmitted directly to destination device 14 via output interface 22 of source device 12. The encoded video data may also (or alternatively) be stored onto storage device 24 for later access by destination device 14 or other devices, for decoding and/or playback.

Destination device 14 includes an input interface 26, a video decoder 30, and a display device 28. In some cases, input interface 26 may include a receiver and/or a modem. Input interface 26 of destination device 14 receives the encoded video data over link 16 or from storage device 24. The encoded video data communicated over link 16, or provided on storage device 24, may include a variety of syntax elements generated by video encoder 20 for use by a video decoder, such as video decoder 30, in decoding the video data. Such syntax elements may be included with the encoded video data transmitted on a communication medium, stored on a storage medium, or stored on a file server.

Display device 28 may be integrated with, or be external to, destination device 14. In some examples, destination device 14 may include an integrated display device and also be configured to interface with an external display device. In other examples, destination device 14 may be a display device. In general, display device 28 displays the decoded video data to a user, and may comprise any of a variety of display devices such as a liquid crystal display (LCD), a plasma display, an organic light emitting diode (OLED) display, or another type of display device.

Video encoder 20 and video decoder 30 may operate according to a video compression standard, such as the High Efficiency Video Coding (HEVC) standard presently under development by the Joint Collaborative Team on Video Coding (JCT-VC) of ITU-T Video Coding Experts Group (VCEG) and ISO/IEC Motion Picture Experts Group (MPEG), and may conform to the HEVC Test Model (HM). Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples of video compression standards include MPEG-2 and ITU-T H.263. A recent draft of the HEVC standard, referred to as "HEVC Working Draft 8" or "WD8," is described in document JCTVC-J1003_d7, Bross et al., "High efficiency video coding (HEVC) text specification draft 8," Joint Collaborative Team on Video Coding (JCT-VC) of ITU-T SG16 WP3 and ISO/IEC JTC1/SC29/WG11, 10th Meeting: Stockholm, SE, 11-20 Jul. 2012, which, as of Oct. 2, 2012, is downloadable from http://phenix.int-evry.fr/jct/doc_end_user/documents/10_Stockholmm/wg11/JCTVC-J1003-v8.zip.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder or decoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder ("CODEC") in a respective device.

The HEVC standardization efforts are based on an evolving model of a video coding device referred to as the HEVC Test Model (HM). The HM presumes several additional capabilities of video coding devices relative to existing devices according to, e.g., ITU-T H.264/AVC. For example, whereas H.264 provides nine intra-prediction encoding modes, the HM may provide as many as thirty-five intra-prediction encoding modes.

In general, the working model of the HM describes that a video frame or picture may be divided into a sequence of treeblocks or largest coding units (LCU) that include both luma and chroma samples. A treeblock has a similar purpose as a macroblock of the H.264 standard. A slice includes a number of consecutive treeblocks in coding order. A video frame or picture may be partitioned into one or more slices. Each treeblock may be split into coding units (CUs) according to a quadtree. For example, a treeblock, as a root node of the quadtree, may be split into four child nodes, and each child node may in turn be a parent node and be split into another four child nodes. A final, unsplit child node, as a leaf node of the quadtree, comprises a coding node, i.e., a coded video block. Syntax data associated with a coded bitstream may define a maximum number of times a treeblock may be split, and may also define a minimum size of the coding nodes.

A CU includes a coding node and prediction units (PUs) and transform units (TUs) associated with the coding node. A size of the CU corresponds to a size of the coding node and must be square in shape. The size of the CU may range from 8×8 pixels up to the size of the treeblock with a maximum of 64×64 pixels or greater. Each CU may contain one or more PUs and one or more TUs. Syntax data associated with a CU may describe, for example, partitioning of the CU into one or more PUs. Partitioning modes may differ between whether the CU is skip or direct mode encoded, intra-prediction mode encoded, or inter-prediction mode encoded. PUs may be partitioned to be non-square in shape. Syntax data associated with a CU may also describe, for example, partitioning of the CU into one or more TUs according to a quadtree. A TU can be square or non-square in shape.

The HEVC standard allows for transformations according to TUs, which may be different for different CUs. The TUs are typically sized based on the size of PUs within a given CU defined for a partitioned LCU, although this may not always be the case. The TUs are typically the same size or smaller than the PUs. In some examples, residual samples corresponding to a CU may be subdivided into smaller units using a quadtree structure known as "residual quad tree" (RQT). The leaf nodes of the RQT may be referred to as TUs. Pixel difference values associated with the TUs may be transformed to produce transform coefficients, which may be quantized.

In general, a PU includes data related to the prediction process. For example, when the PU is intra-mode encoded, the PU may include data describing an intra-prediction mode for the PU. As another example, when the PU is inter-mode encoded, the PU may include data defining a motion vector for the PU. The data defining the motion vector for a PU may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list (e.g., List 0, List 1, or List C) for the motion vector.

In general, a TU is used for the transform and quantization processes. A given CU having one or more PUs may also include one or more TUs. Following prediction, video encoder 20 may calculate residual values corresponding to the PU. The residual values comprise pixel difference values that may be transformed into transform coefficients, quantized, and scanned using the TUs to produce serialized transform coefficients for entropy coding. This disclosure typically uses the term "video block," or simply "block," to refer to a coding node of a CU. In some specific cases, this disclosure may also use the term "video block" to refer to a treeblock, i.e., LCU, or a CU, which includes a coding node and PUs and TUs.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may correspond to a coding node within a CU. The video blocks may have fixed or varying sizes, and may differ in size according to a specified coding standard.

As an example, the HM supports prediction in various PU sizes. Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a non-negative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

Following intra-predictive or inter-predictive coding using the PUs of a CU, video encoder 20 may calculate residual data for the TUs of the CU. The PUs may comprise pixel data in the spatial domain (also referred to as the pixel domain) and the TUs may comprise coefficients in the transform domain following application of a transform, e.g., a discrete cosine transform (DCT), an integer transform, a wavelet transform, or a conceptually similar transform to residual video data. The residual data may correspond to pixel differences between pixels of the unencoded picture and prediction values corresponding to the PUs. Video encoder 20 may form the TUs including the residual data for the CU, and then transform the TUs to produce transform coefficients for the CU.

Following any transforms to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m.

In some examples, video encoder 20 may utilize a predefined scanning, or "scan" order to scan the quantized transform coefficients to produce a serialized vector that can be entropy encoded. In other examples, video encoder 20 may perform an adaptive scan. After scanning the quantized transform coefficients to form a one-dimensional vector, video encoder 20 may entropy encode the one-dimensional vector, e.g., according to context adaptive variable length coding (CAVLC), context adaptive binary arithmetic coding (CABAC), syntax-based context-adaptive binary arithmetic coding (SBAC), Probability Interval Partitioning Entropy (PIPE) coding, or another entropy encoding methodology. Video encoder 20 may also entropy encode syntax elements associated with the encoded video data for use by video decoder 30 in decoding the video data.

To perform CABAC, video encoder 20 may assign a context within a context model to a symbol to be transmitted. The context may relate to, for example, whether or not neighboring values of the symbol are zero-valued. To perform CAVLC, video encoder 20 may select a variable length code for a symbol to be transmitted. Codewords in VLC may be constructed such that relatively shorter codes correspond to more probable symbols, while relatively longer codes correspond to less probable symbols. In this manner, the use of VLC may achieve a bit savings over, for example, using equal-length codewords for each symbol to be transmitted. The probability determination may be based on a context assigned to the symbol.

Figure 2:
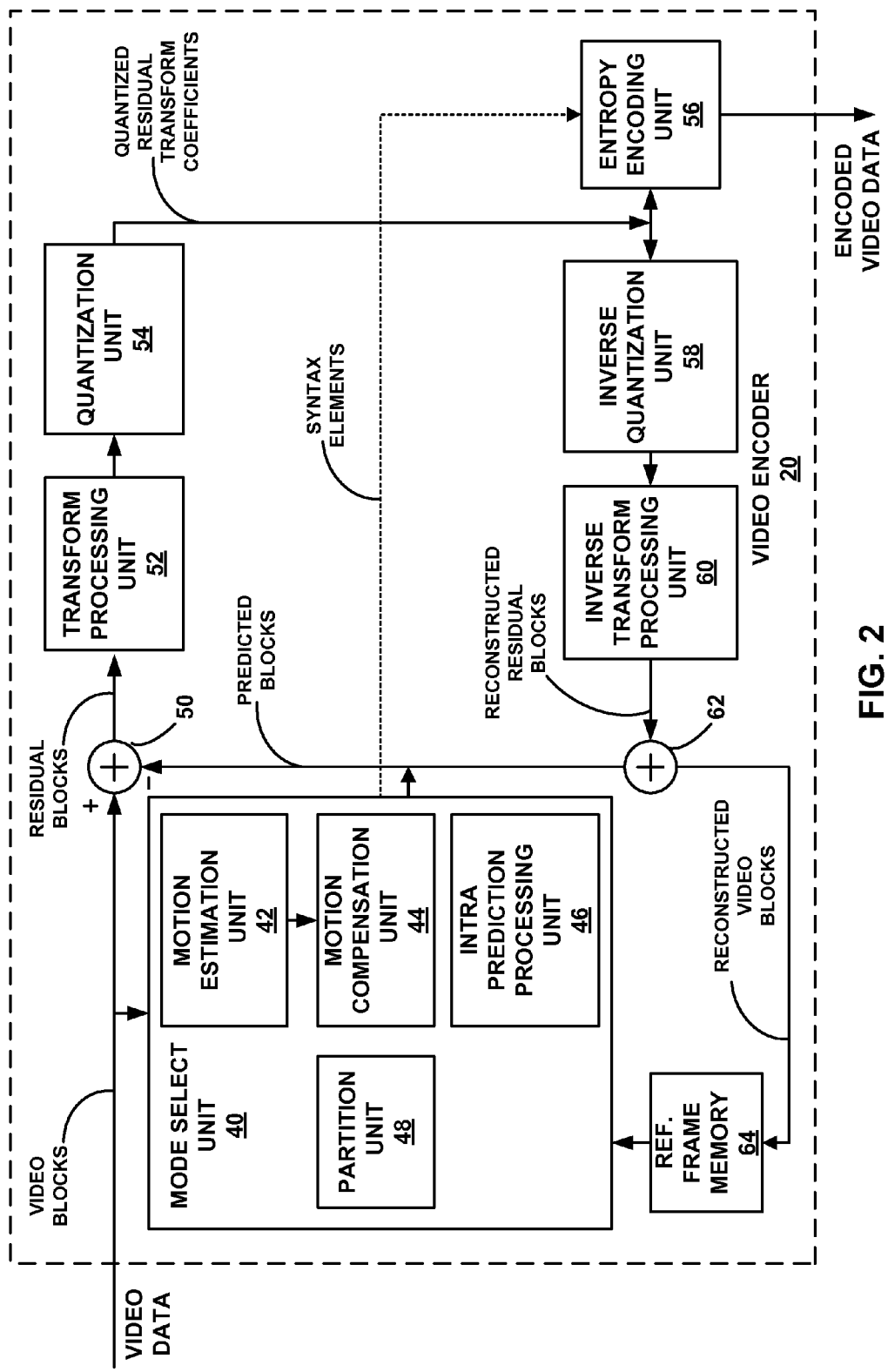
FIG. 2 is a block diagram that illustrates an example of a video encoder that may perform the techniques for context adaptive entropy coding with a reduced initialization value set, consistent with the techniques of this disclosure.
Figure 3:
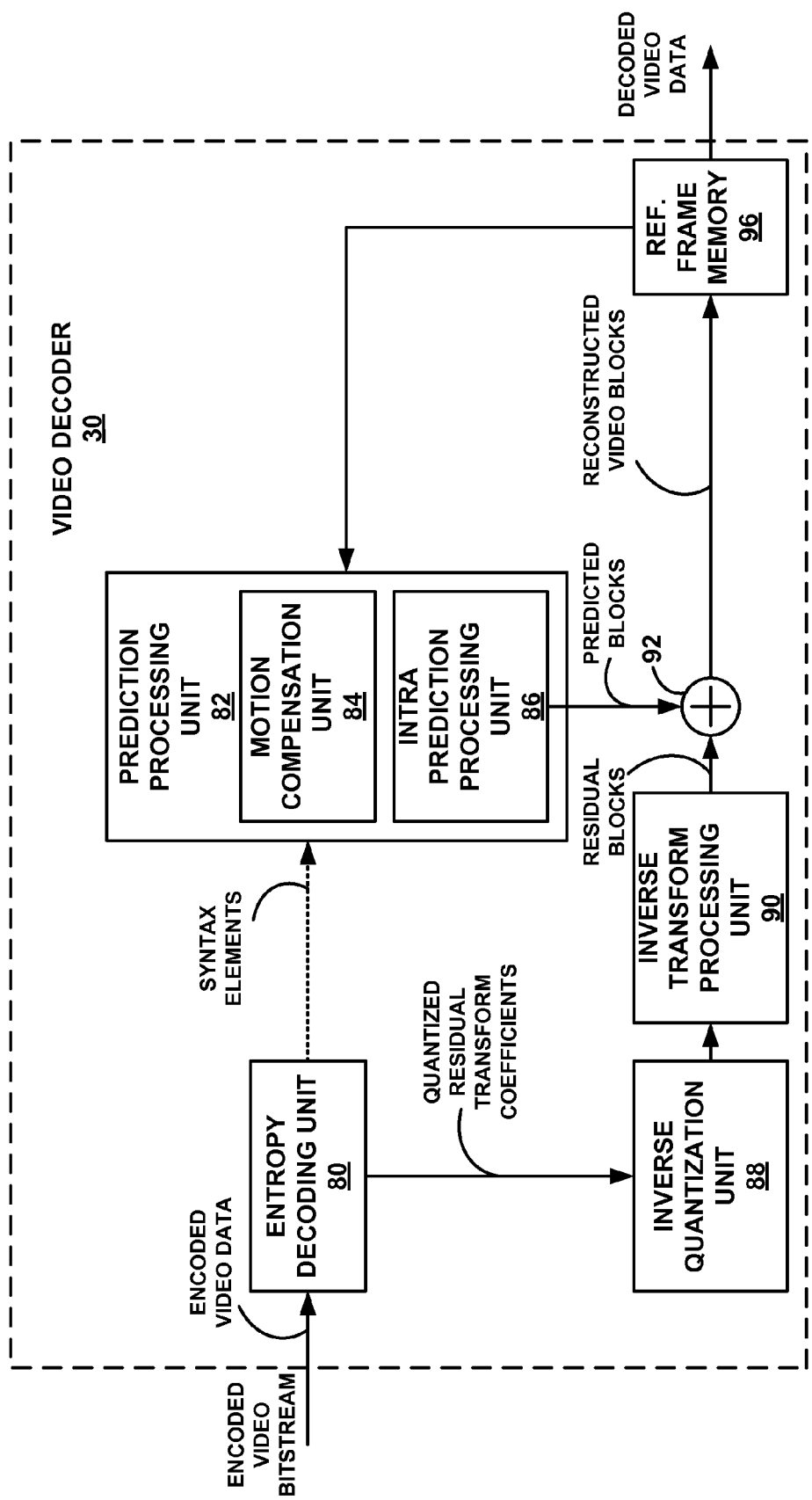
FIG. 3 is a block diagram that illustrates an example of a video decoder that may perform the techniques for context adaptive entropy coding with a reduced initialization value set, consistent with the techniques of this disclosure.

The following is discussed with reference to video encoder 20 and video decoder 30, as various components thereof, as depicted in FIGS. 2 and 3, and as described in greater detail below. As previously explained, according to some video coding techniques, in video encoder 20, a frame of an original video sequence may be partitioned into rectangular regions, or "blocks," which may be coded using Intra-mode (I-mode) or Inter-mode (P-mode or B-mode) coding. The blocks may be coded using some type of transform coding, such as discrete cosine transform (DCT) coding. However, pure transform-based coding may only reduce inter-pixel correlation within a particular block without considering inter-block correlation of pixels, and may still produce relatively high bit-rates for transmission. Additionally, some digital image coding standards may also exploit certain methods that may reduce the correlation of pixel values between blocks.

In general, blocks encoded in P-mode are predicted from one of the previously coded and transmitted frames. The prediction information of a block is represented by a two-dimensional (2D) motion vector. For blocks encoded in I-mode, the predicted block is formed using spatial prediction from already encoded neighboring blocks within the same frame. The prediction error, i.e., the difference between the block being encoded and the predicted block, is represented as a set of weighted basis functions of some discrete transform. The transform is typically performed on an N×N block basis. The weights, i.e., transform coefficients, may be subsequently quantized. Quantization introduces loss of information and, therefore, quantized coefficients have lower precision than the original coefficients.

Quantized transform coefficients, together with motion vectors and some control information, form a complete coded sequence representation, and are referred to as syntax elements. Prior to transmission from video encoder 20 to video decoder 30, all syntax elements are entropy coded so as to further reduce the number of bits needed for their representation.

Video decoder 30 obtains the block in the current frame by first constructing a prediction block in the same manner as described above with reference to video encoder 20, and by adding to the prediction block the compressed prediction error (represented by a residual block). The compressed prediction error is found by weighting the transform basis functions using the quantized coefficients. The difference between the reconstructed frame and the original frame is called reconstruction error.

This disclosure relates to techniques for determining initial context states, i.e., initial probabilities, for contexts used to code video data as part of performing a context adaptive entropy coding process, such as, for example, a CABAC process. Arithmetic coding is a form of entropy coding used in many compression algorithms that have high coding efficiency, since it is capable of mapping symbols to non-integer length codewords. An example of an arithmetic coding algorithm is Context Based (or "Context Adaptive") Binary Arithmetic Coding (CABAC) used in H.264/AVC.

In general, coding data symbols using CABAC involves one or more of the following steps:

(1) Binarization: If a symbol to be coded is non-binary valued, a video coder, such as video encoder 20 or video decoder 30, maps the symbol to a sequence of so-called "bins." Each bin can have a value of "0" or "1."

(2) Context Assignment: The video coder assigns each bin (in regular mode) to a context. For example, the video coder uses a context model to determine how a context for a given bin is to be calculated based on information available for the bin, such as values of previously encoded symbols, or bin number.

(3) Bin encoding: An arithmetic encoder, such as video encoder 20, encodes bins. To encode a bin, the arithmetic encoder (e.g., video encoder 20) uses as an input a probability of the bin's value, i.e., a probability that the bin's value is equal to "0," and a probability that the bin's value is equal to "1." The (estimated) probability of each context is represented by an integer value called a "context state." Each context has a state, and thus the state (i.e., estimated probability) is the same for bins assigned to one context, and differs between contexts.

(4) State update: The video coder updates the probability (state) for a selected context based on the actual coded value of the bin (e.g., if the bin value was "1," the probability of "1s" may be increased).

Before initiating a CABAC process, the video coder may assign an initial context state to each context. A linear model has been used to assign initial context states for each context in H.264 and version "HM4.0" of the HEVC standard presently under development. Specifically, for each context, there may exist pre-defined parameters slope ("m") and intersection ("n"), which may be referred to as initialization values. The video coder may derive an initial context state for a particular context using the following expressions:

$$\text{Int } i\text{InitState} = ((m * iQP)/16) + n; \qquad \text{EQ1}$$

$$i\text{InitState} = \min(\max(1, i\text{InitState}), 126); \qquad \text{EQ2}$$

where iQP is a quantization parameter (sometimes referred to as an initialization QP) associated with the video data being coded. In version "HM 5.0" of HEVC, the initialization value for each context is represented as an 8-bit integer value "m8," (rather m and n, as is the case in H.264 and HM4.0), and a piece-wise linear function is used to derive the CABAC initial context states (i.e., using m8 and iQP values).

For different slice types (e.g., I-mode, P-mode, and B-mode), the estimated probabilities described above for the same syntax element may be different. Accordingly, a number of existing video compression standards and/or systems use different sets of initialization values for different slice types. As a result, the total storage of the initialization values used by these standards and/or systems may be represented as follows:

$$\text{No. of initialization values} = \text{No. of contexts} * \text{No. of slice types} \qquad \text{EQ. 3}$$

The various approaches described above, relating to determining initial context states for one or more contexts (or "initializing" the one or more contexts, generally) of a context adaptive entropy coding process, have several drawbacks. For example, as illustrated by the relationship in EQ. 3 provided above, the number of initialization values (e.g., "No. of initialization values" of EQ. 3 shown above) for a particular context adaptive entropy coding process may be relatively large, and may require a significant amount of data storage.

This disclosure describes several techniques that may, in some cases, reduce or eliminate some of the drawbacks described above. For example, this disclosure provides some techniques that may be used to reduce quantities of data stored for initialization values of a context adaptive entropy coding process, by allowing initialization of contexts of syntax elements of slices of video data having different slice types using the same, or "common," initialization values (or initialization value "sets"). In other words, the disclosed techniques may enable coding the slices of video data having the different slice types by "sharing" one or more initialization value sets between different slice types.

As one example, "M" different slice types, e.g., SliceType_0, . . . , SliceType_M−1, and "N" sets of initialization values, e.g., InitializationSet_0, . . . , InitializationSet_N−1, may be used. A mapping, or a "mapping function," e.g., "InitializationSet_k=f(SliceType_i)," may be defined to map different slice types to different initialization value sets. For example, when multiple slice types are mapped to the same initialization value set, the data storage saving described above may be achieved.

In some examples, three different slice types (e.g., I-mode, P-mode, and B-mode), and only two initialization value sets, e.g., Set1 and Set2, may be used. In these examples, an I-mode slice and a B-mode slice may use initialization value Set1, and a P-mode slice may use initialization value Set2. In other examples, the P-mode slice and the B-mode slice may use initialization value Set1, and the B-mode slice may use initialization value Set2, and so forth. In yet other examples, three slice types and only one initialization value set may be used. In these examples, all three slice types (i.e., the I-mode, P-mode, and B-mode) may use the same initialization value set.

As another example, the mapping function described above (i.e., the mapping function used to map a slice type of a slice of video data to an initialization value set used to code one or more syntax elements of the slice) may be pre-defined, or "fixed," e.g., known to both video encoder 20 and video decoder 30. Alternatively, the mapping function may be user-specified, and/or be explicitly signaled to video decoder 30 using some high-level syntax information, such as, e.g., adaptive parameter set (APS), picture parameter set (PPS), sequence parameter set (SPS), video parameter set (VPS), slice header, frame header, sequence header, or the like). In other examples, the mapping function may also be adaptive, such that, for example, the mapping function may be dependent on "side" information associated with the video data, such as, e.g., a QP, frame resolution, a GOP structure, or other information, associated with the video data.

As yet another example, the techniques described above with reference to the previous examples may apply to only a subset of total contexts. For example, the total contexts may include 253 contexts, such as in HM 5.0, i.e., ctx0 to ctx252. As one example, a subset of the total contexts, e.g., "CtxSubset," may be defined. As such, only contexts that belong to this subset may be initialized in the manner described above, i.e., for different slice types, using the same initialization value set. For other contexts (i.e., contexts that do not belong to this subset), the initialization values may be different for different slice types. An example of such a subset of contexts is a subset that includes contexts that relate to coefficient coding, such as contexts used to code last significant coefficient position data (e.g., "last_significant_coeff_flag"), significance map data (e.g., "significant_coeff_flag"), level data (e.g., "coeff_abs_level_minus1" and "coeff_sign_flag"), "larger-than-one" flag data (e.g., "larger_than_one_flag"), "larger-than-two" flag data (e.g., "larger_than_two_flag"), and so forth. In other words, the subset of contexts may correspond to one or more types of syntax elements associated with the video data.

In some examples, different subsets of contexts may correspond to different initialization value sets. In particular, as one example, a first subset of contexts (e.g., "subset 1") may be initialized using a first group of initialization value sets, while a second subset of contexts (e.g., "subset 2") may be initialized using a second, different group of initialization value sets. In this example, each of the first and second groups of initialization value sets may include one or more initialization value sets.

In one example, the definition of the subset of contexts may be pre-defined, or fixed, e.g., known to both video encoder 20 and video decoder 30. In another example, the definition of the subset of contexts may be user-selected, and/or explicitly signaled to video decoder 30 within the high-level syntax information described above. Additionally, the definition of the subset of contexts may also be adaptive, such that, for example, the definition can be dependent on the side information previously described.

As still another example, multiple subsets of contexts, e.g., "CtxSubseti," may be defined, and the mapping function for initialization value sharing for the different subsets of contexts may be different among the multiple subsets of contexts. In a similar manner as described in previous examples, the definition of the multiple subsets of contexts can be pre-defined, user-specified, and/or dependent on the side information associated with the video data, as described above. Additionally, the mapping functions can be pre-defined, user-specified, and/or dependent on the side information associated with the video data, as also previous described.

As illustrated in EQ. 1 and EQ. 2 above, the initial CABAC state ("iInitState") values are a function (i.e., as indicated by designator "f") of the initialization values ("InitValue") (e.g., "m" and "n," or "m8" values) and the "iQP" value, i.e., iInitState=f(InitValue, iQP). As another example consistent with the disclosed techniques, for contexts associated with different slice types but sharing the same initialization values (or the same initialization value "set"), the context initialization process may also depend on the slice type. In other words, the context initialization process may be performed using the following relationship:

$$iInitState = G(InitValue, iQP, SliceType)$$

where iInitState is a function (i.e., as indicated by designator "G"), of InitValue, iQP, as well as "SliceType." In this example, SliceType corresponds to a slice type associated with the video data being coded.

In one example, a "QPOffset," or "dQP," may be defined for each slice type, and the initial context state may be calculated as follows:

$$\text{Int } iInitState = ((m*(iQP+dQP))/16)+n; \qquad \text{EQ4}$$

$$iInitState = \min(\max(1, iInitState), 126); \qquad \text{EQ5}$$

Generally, the value of dQP of an I-mode slice may be smaller than a value of dQP for B-mode and P-mode slices, in some examples. An example of this relationship is provided in Table I below:

TABLE I

| SliceType | I-mode | P-mode | B-mode |
|---|---|---|---|
| dQP | −3 | 0 | 0 |

As another example, the techniques described above, wherein multiple slices having different slice types share the same initialization value set, but wherein the context initialization process for each slice also depends on the corresponding slice type, may be applied only to a subset of total contexts, in a similar manner as previously described.

In one example, the definition of the subset of contexts may be pre-defined, e.g., known to both video encoder 20 and video decoder 30. In another example, the definition of the subset of contexts may be user-selected and/or explicitly signaled to video decoder 30 with the high-level syntax information described above. Furthermore, the definition of the subset of contexts may also be adaptive, such that the definition can be dependent on the side information previously described.

The techniques described above generally relate to initializing one or more contexts of a context adaptive entropy coding process used to code one or more syntax elements of one or more slices of video data, by selecting an initialization value set based on slice type information associated with the one or more slices. In addition to the above-described techniques, this disclosure also includes techniques for initializing one or more contexts of a context adaptive entropy coding process used to code one or more syntax elements of one or more slices of video data, by selecting an initialization value set based on one or more initialization indicator values associated with the one or more slices.

In particular, in accordance with the disclosed techniques, rather than selecting initialization value sets based strictly on a slice type, as illustrated by the examples above, video encoder 20 and/or video decoder 30 may be configured to adaptively select one or more initialization value sets to initialize one or more contexts used to code one or more syntax elements of a slice of video data.

As one example, video encoder 20 and/or video decoder 30 may be configured to infer an initialization value set for a slice of video data based on the side information associated with the video data, as described above. In this manner, video encoder 20 and/or video decoder 30 may be configured to determine an initialization value set in a plurality of initialization value sets, each of the initialization value sets defining respective initial context states for one or more syntax elements of a slice of video data, based on one or more characteristics of the slice. In this example, in contrast to the previously-described techniques, the one or more characteristics do not include a slice type of the slice of video data. Also in this example, video encoder 20 and/or video decoder 30 may be further configured to code one or more syntax elements of the slice of video data based on the determined initialization value set.

As another example, for each slice of video data, video encoder 20 may transmit, and video decoder 30 may receive, a syntax element (e.g., a so-called "initialization indicator value") of a syntax element type "cabac_init_idc" that specifies which particular initialization value set is used for the respective slice of video data (i.e., used to code one or more syntax elements associated with the respective "current" slice). For example, suppose there are "N" initialization value sets, set0, set1, . . . , setN−1. The range of values (i.e., "initialization indicator" values) of cabac_init_idc in this example may be from "0" to "N−1." "Cabac_init_idc=i" (as coded/signaled for a current slice) may specify that "set$_i$" is selected for the current slice. In some examples, the selection of the initialization value set for a particular slice of video data may not be related to a slice type of the slice, but instead may be purely dependent on a value of cabac_init_idc for the slice. The selected initialization value set may be any one among set0, set1, setN−1, in some examples.

In some examples, the value of cabac_init_idc may be explicitly transmitted using the high level syntax described above, and can be sent as a raw byte sequence payload (RBSP) or encoded using fixed length codes, variable length codes, or arithmetic codes.

As yet another example, in a similar manner as previously described, the techniques described above with reference to initialization indicator values of syntax element type cabac_init_idc may only be applied to a subset of total contexts. For example, in HM 5.0, there are 253 contexts, specified as ctx0 to ctx252, as previously explained. A subset of contexts, CtxSubset, that includes only some of the 253 contexts may once again be defined. In this example, only when a context used to code a particular syntax element type belongs to this subset of contexts, the selection of the initialization value set for the context may be based on a value of cabac_init_idc (or inferred based on side information, as described above). For other contexts (i.e., contexts that do not belong to this subset), the initialization values, or initialization value set, may be determined or selected using other techniques, e.g., techniques described above with reference to H.264/AVC.

In one example, the definition of the subset of contexts may be pre-defined, and available to both video encoder 20 and video decoder 30. In another example, the definition of the subset of contexts may be user-selected and/or explicitly signaled to video decoder 30 within the high-level syntax described above. The definition of the subset of contexts can also be adaptive, which may mean that the mapping can be dependent on the side information described above.

In some examples, multiple syntax elements (e.g., cabac_init_idc0, cabac_init_idc1, . . . , cabac_init_idcN) may be transmitted, and each may correspond to a subset of the total contexts. For example, "cabac_init_idc0" may correspond to a subset of contexts "CtxSubset0," which may include coefficient coding-related contexts. "Cabac_init_idc0=i" may indicate that coefficient-coding related contexts use the "i-th" initialization value set. Likewise, other cabac_init_idc values may relate to other syntax element subsets. In some examples, the definition of the subsets may be pre-defined, and known to both video encoder 20 and video decoder 30. In other examples, the definition of the subset may be user-selected and explicitly signaled to video decoder 30 within the high-level syntax described above. The definitions of the subsets of contexts may also be adaptive, e.g., the mapping can be dependent on the side information previously described.

In some examples, values for cabac_init_idc may be transmitted for each slice, e.g., in each slice header. In other examples, a value for cabac_init_idc may be transmitted for a current slice, e.g., Slice_0. Then, for the following slices of the same type, the selection of the initialization value set may be the same as Slice_0 until a new value of cabac_init_idc is received at some point to override the previous selection. In this manner, video encoder 20 and/or video decoder 30 may code data of a first set of one or more subsequent slices, following a current slice, based on a first initialization value set in a plurality of initialization value sets signaled for the current slice, code a second value representative of a second initialization value set in the plurality of initialization value sets, and code a second set of one or more subsequent slices based on the second initialization value set.

In some examples, a value for cabac_init_idc may have an effect on multiple slice types. For example, if "cabac_init_idc=1," for the following slices, the initialization value set currently used by a B slice and an I slice may be exchanged. In another example, cabac_init_idc can cause a shift of initialization value sets. For example, I, P, and B slices may currently use initialization value sets 0, 1, and 2, respectively. After receiving cabc_init_idc=1, the I, P, and B slices may use initialization set 1, 2, and 0, respectively.

Moreover, as noted above, in some examples, the value of cabac_init_idc (i.e., the initialization indicator value corresponding to syntax element type cabac_init_idc) need not be explicitly transmitted. Instead, in these examples, the value of cabac_init_idc may be inferred using the side information described above.

In some examples, the context initialization techniques described above may be used in conjunction with any context adaptive entropy coding methodology, including CABAC, SBAC, PIPE, or another context adaptive entropy coding methodology. CABAC is described in this disclosure for purposes of illustration only, and without limitation as to the techniques broadly described in this disclosure as a whole. Also, as previously explained, the disclosed techniques may be applied to coding of other types of data, generally, e.g., in addition to, or in place of, video data.

As one example, video encoder 20 and/or video decoder 30 may be configured to code one or more blocks of video data, as described above. For example, each of the one or more blocks may correspond to a particular slice of a frame of video data. In this example, video encoder 20 and/or video decoder 30 may be configured to code a first syntax element, conforming to a particular type of syntax element, of a first slice of video data, conforming to a first slice type, using an initialization value set. Also in this example, video encoder 20 and/or video decoder 30 may be further configured to subsequently code a second syntax element, conforming to the particular type of syntax element (i.e., to the same type of syntax element as that of the first syntax element), of a second slice of video data, conforming to a second slice type, using the initialization value set.

In some examples, the first slice type may be different from the second slice type. For example, while the first slice type may correspond to any one of the spatially-predicted "I-" slice type and the temporally-predicted "P-" and "B-" slice types described above, the second slice type may correspond to any other one of the above-described slice types. Furthermore, in other examples, at least one of the first slice type and the second slice type may be a temporally predicted slice type. For example, at least one of the first and second slice types may correspond to any one of the temporally-predicted "P-" and "B-" slice types.

In addition to the coding properties attributed to each of video encoder 20 and video decoder 30, as illustrated by the examples above, the techniques of this disclosure also include generating configuration data (e.g., one or more syntax elements) that associates two or more different types of slices of video data with a common initialization value set. In this manner, the disclosed techniques may enable video encoder 20 and/or video decoder 30 to interpret the configuration data, and, based on the configuration data, use the same initialization value set to code syntax elements of two or more different slices having different slice types.

In this manner, by enabling video encoder 20 and/or video decoder 30 to use the same, or common, initialization value set to code (i.e., encode and/or decode) the first and second syntax elements of the first and second slices, the techniques of this disclosure may reduce the complexity (e.g., simplify processing and/or storage resources, or reduce the usage thereof) of video encoder 20 and/or video decoder 30 when using video encoder 20 and/or video decoder 30 to code data, such as, e.g., video data.

Additionally, the disclosed techniques may enable video encoder 20 and/or video decoder to code the data more efficiently. For example, the techniques may enable video encoder 20 and/or video decoder 30 to initialize one or more contexts of a context adaptive entropy coding process (e.g., a CABAC process) used to code the data based on slice type information associated with the data, or, alternatively, one or more initialization indicator values associated with the data. As a result, upon being initialized, the one or more contexts may include probability estimates that are more accurate relative to probability estimates determined using other context initialization techniques. As such, video encoder 20 and/or video decoder 30 may code the data more efficiently (e.g., using fewer bits), compared to other techniques.

Video encoder 20 and video decoder 30 each may be implemented as any of a variety of suitable encoder or decoder circuitry, as applicable, such as one or more microprocessors, DSPs, ASICs, FPGAs, discrete logic circuitry, software, hardware, firmware, or any combinations thereof. Each of video encoder 20 and video decoder 30 may be included in one or more encoders or decoders, either of which may be integrated as part of a combined video encoder/decoder (CODEC). An apparatus including video encoder 20 and/or video decoder 30 may comprise an integrated circuit (IC), a microprocessor, and/or a wireless communication device, such as a cellular telephone.

FIG. 2 is a block diagram that illustrates an example of a video encoder that may perform the techniques for context adaptive entropy coding with a reduced initialization value set, consistent with the techniques of this disclosure. Video encoder 20 may perform intra- and inter-coding of video blocks within video slices. Intra-coding relies on spatial prediction to reduce or remove spatial redundancy in video within a given video frame or picture. Inter-coding relies on temporal prediction to reduce or remove temporal redundancy in video within adjacent frames or pictures of a video sequence. Intra-mode (I mode) may refer to any of several spatial based compression modes. Inter-modes, such as uni-directional prediction (P mode) or bi-prediction (B mode), may refer to any of several temporal-based compression modes.

In the example of FIG. 2, video encoder 20 includes mode select unit 40, motion estimation unit 42, motion compensation unit 44, intra-prediction module 46, reference frame memory 64, summer 50, transform processing unit 52, quantization unit 54, and entropy encoding unit 56. For video block reconstruction, video encoder 20 also includes inverse quantization unit 58, inverse transform processing unit 60, and summer 62. A deblocking filter may also be included to filter block boundaries to remove blockiness artifacts from reconstructed video.

As shown in FIG. 2, video encoder 20 receives a current video block within a video slice to be encoded. The slice may be divided into multiple video blocks. Mode select unit 40 may select one of the coding modes, intra- or inter-, for the current video block based on error results. If the intra- or inter-modes are selected, mode select unit 40 provides the resulting intra- or inter-coded block to summer 50 to generate residual block data and to summer 62 to reconstruct the encoded block for use as a reference picture. Intra-prediction module 46 performs intra-predictive coding of the current video block relative to one or more neighboring blocks in the same frame or slice as the current block to be coded to provide spatial compression. Motion estimation unit 42 and motion compensation unit 44 perform inter-predictive coding of the current video block relative to one or more predictive blocks in one or more reference pictures to provide temporal compression.

In the case of inter-coding, motion estimation unit 42 may be configured to determine the inter-prediction mode for a video slice according to a predetermined pattern for a video sequence. The predetermined pattern may designate video slices in the sequence as P slices, B slices or GPB slices. Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference picture.

A predictive block is a block that is found to closely match the PU of the video block to be coded in terms of pixel difference, which may be determined by sum of absolute difference (SAD), sum of square difference (SSD), or other difference metrics. In some examples, video encoder 20 may calculate values for sub-integer pixel positions of reference pictures stored in reference frame memory 64. For example, video encoder 20 may calculate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in reference frame memory 64. Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation. Upon receiving the motion vector for the PU of the current video block, motion compensation unit 44 may locate the predictive block to which the motion vector points in one of the reference picture lists. Video encoder 20 forms a residual video block by subtracting pixel values of the predictive block from the pixel values of the current video block being coded, forming pixel difference values. The pixel difference values form residual data for the block, and may include both luma and chroma difference components. Summer 50 represents the component or components that perform this subtraction operation. Motion compensation unit 44 may also generate syntax elements associated with the video blocks and the video slice for use by video decoder 30 in decoding the video blocks of the video slice.

After motion compensation unit 44 generates the predictive block for the current video block, video encoder 20 forms a residual video block by subtracting the predictive block from the current video block. The residual video data in the residual block may be included in one or more TUs and applied to transform processing unit 52. Transform processing unit 52 transforms the residual video data into residual transform coefficients using a transform, such as a discrete cosine transform (DCT) or a conceptually similar transform. Transform processing unit 52 may convert the residual video data from a pixel domain to a transform domain, such as a frequency domain.

Transform processing unit 52 may send the resulting transform coefficients to quantization unit 54. Quantization unit 54 quantizes the transform coefficients to further reduce bit rate. The quantization process may reduce the bit depth associated with some or all of the coefficients. The degree of quantization may be modified by adjusting a QP. In some examples, quantization unit 54 may then perform a scan of the matrix including the quantized transform coefficients. Alternatively, entropy encoding unit 56 may perform the scan.

Following quantization, entropy encoding unit 56 entropy encodes the quantized transform coefficients. For example, entropy encoding unit 56 may perform CAVLC, CABAC, or another entropy encoding technique. Following the entropy encoding by entropy encoding unit 56, the encoded bitstream may be transmitted to video decoder 30, or archived for later transmission or retrieval by video decoder 30. Entropy encoding unit 56 may also entropy encode the motion vectors and the other syntax elements for the current video slice being coded.

Inverse quantization unit 58 and inverse transform processing unit 60 apply inverse quantization and inverse transformation, respectively, to reconstruct the residual block in the pixel domain for later use as a reference block of a reference picture. Motion compensation unit 44 may calculate a reference block by adding the residual block to a predictive block of one of the reference pictures within one of the reference picture lists. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reference block for storage in reference frame memory 64. The reference block may be used by motion estimation unit 42 and motion compensation unit 44 as a reference block to inter-predict a block in a subsequent video frame or picture.

In some examples, video encoder 20 may be configured to encode one or more blocks of video data during a video coding process e.g., for transmission in a bitstream to video decoder 30 and/or storage device 24. For example, the one or more blocks may be included within one or more slices of video data, as previously described. As one example, entropy encoding unit 56 of video encoder 20 may be configured to encode a first syntax element, conforming to a particular type of syntax element, of a first slice of video data, conforming to a first slice type, using an initialization value set. In this example, entropy encoding unit 56 may be further configured to encode a second syntax element, conforming to the particular type of syntax element, of a second slice of video data, conforming to a second slice type, using the initialization value set. For example, as previously described, the first slice type may be different from the second slice type. As also previously described, at least one of the first slice type and the second slice type may be a temporally predicted slice type.

In other examples, entropy encoding unit 56 may be further configured to determine the initialization value set used to encode the first and second syntax elements based on at least one of: (1) the first slice type of the first slice of video data, and the second slice type of the second slice of video data; and (2) a first initialization indicator value for the first slice of video data, and a second initialization indicator value for the second slice of video data. In these examples, each of the first and second initialization indicator values for the first and second slices of video data may indicate a particular initialization value set used to code the corresponding slice of video data.

In some examples, entropy encoding unit 56 may be further configured to determine a first mapping between one or more of the first slice type and a first initialization indicator value for the first slice of video data, and the initialization value set using a first mapping function of one or more mapping functions. That is, entropy encoding unit 56 may be configured with a mapping from a slice type to an initialization value set, a mapping from an initialization indicator value to an initialization value set, or a mapping from both a slice type and an initialization indicator value to an initialization value set. In some examples, entropy encoding unit 56 may be further configured to determine a second mapping between one or more of the second slice type and a second initialization indicator value for the second slice of video data, and the initialization value set using a second mapping function of the one or more mapping functions. Also in these examples, each of the first and second initialization indicator values for the first and second slices of video data may once again indicate a particular initialization value set used to code the corresponding slice of video data.

In the above-described examples, entropy encoding unit 56 (or another component or unit of video encoder 20) may be further configured to encode one or more values representative of at least one of the one or more mapping functions and the first and second initialization indicator values in at least one of a PPS, an SPS, an APS, a VPS, a slice header, a frame header, and a sequence header, associated with the video data.

Alternatively, in the above-describe examples, entropy encoding unit 56 may be further configured to determine at least one of the one or more mapping functions and the first and second initialization indicator values based on one or more of a QP, a frame resolution parameter, and a GOP structure parameter associated with the video data, and a user input.

In other examples, entropy encoding unit 56 may be further configured to determine a subset of contexts of a full set of contexts used to encode each of the first and second slices. In these examples, the subset of contexts may include at least one or more contexts used to code the particular type of syntax element of the first and second syntax elements. Also in these examples, to encode the first and second syntax element using the initialization value set, entropy encoding unit 56 may be configured to initialize one or more contexts of the subset of contexts based on the initialization value set.

In the above-described examples, in a similar manner as described above with reference to the one or more mapping functions and the first and second initialization indicator values, entropy encoding unit 56 (or another component or unit of video encoder 20) may be further configured to encode one or more values that indicate the contexts of the full set of contexts that are included in the subset of contexts in at least one of a PPS, an SPS, an APS, a VPS, a slice header, a frame header, and a sequence header, associated with the video data.

In some examples, also in a similar manner as described above with reference to the one or more mapping functions and the first and second initialization indicator values, to determine the subset of contexts of the full set of contexts, entropy encoding unit 56 may be configured to determine the contexts of the full set of contexts that are included in the subset of contexts based on one or more of a QP, a frame resolution parameter, and a GOP structure parameter associated with the video data, and a user input.

Furthermore, in some examples, to encode the first syntax element and the second syntax element using the initialization value set, entropy encoding unit 56 may be configured to determine an initial context state for each of one or more contexts that are used to code at least the particular type of syntax element of the first and second syntax elements based on the initialization value set and a corresponding one of the first and second slice types of the first and second slices of video data to which the respective syntax element belongs. In these examples, video encoder 20 may determine the initialization value set based on the first slice type of the first slice of video data, and the second slice type of the second slice of video data.

In the above-described examples, to determine the initial context state for each of the one or more contexts based on the initialization value set and the corresponding one of the first and second slice types, entropy encoding unit 56 may be configured to determine the respective initial context state based on one or more values of the initialization value set, a QP value, and a QP offset value determined based on the corresponding one of the first and second slice types.

As previously described, in some examples, the initialization value set may include one of: (1) a slope value and a separate intersection value; and (2) a single value representing both the slope value and the intersection value. For example, the initialization value set may include at least one "pair" of the slope and intersection values, or at least one single value representing both the slope value and the intersection value, in some examples.

As illustrated by the examples above, the techniques of this disclosure may enable video encoder 20 to encode multiple syntax elements (e.g., for decoding by video decoder 30, and/or for storage within storage device 24), each conforming to the same type of syntax element, for multiple slices of video data having different slice types using a context adaptive entropy coding process (e.g., a CABAC process) based on the same, or common, initialization value set. In some examples, the particular type of syntax element may be used to indicate values of one or more coefficients, or other syntax information, for one or more blocks of video data. Specifically, according to the disclosed techniques, video encoder 20 may use the initialization value set to determine initial context states for (i.e., "initialize") one or more contexts of the context adaptive entropy coding process prior to encoding each of the multiple syntax elements using the contexts. As a result, the techniques disclosed herein may, in some cases, reduce complexity (e.g., simplify processing and/or storage resources, or reduce the usage thereof) of video encoder 20 used to encode the multiple syntax elements for the multiple slices of video data.

Additionally, the disclosed techniques may enable video encoder 20 to encode data, e.g., video data, more efficiently. For example, the techniques may enable video encoder 20 to initialize one or more contexts of a context adaptive entropy coding process (e.g., a CABAC process) used to encode the data based on slice type information associated with the data, or, alternatively, one or more initialization indicator values associated with the data. As a result, upon being initialized, the one or more contexts may include probability estimates that are more accurate relative to probability estimates determined using other context initialization techniques. As such, video encoder 20 may encode the data more efficiently (e.g., using fewer bits), compared to other techniques.

In this manner, video encoder 20 represents an example of a video coder configured to code a first syntax element, conforming to a particular type of syntax element, of a first slice of video data, conforming to a first slice type, using an initialization value set, and code a second syntax element, conforming to the particular type of syntax element, of a second slice of video data, conforming to a second slice type, using the initialization value set, wherein the first slice type is different from the second slice type, and wherein at least one of the first slice type and the second slice type is a temporally predicted slice type.

FIG. 3 is a block diagram that illustrates an example of a video decoder that may perform the techniques for context adaptive entropy coding with a reduced initialization value set, consistent with the techniques of this disclosure. In the example of FIG. 3, video decoder 30 includes an entropy decoding unit 80, a prediction processing unit 82, an inverse quantization unit 88, an inverse transform processing unit 90, a summer 92, and a reference frame memory 96. Prediction processing unit 82 includes motion compensation unit 84 and intra-prediction processing unit 86. Video decoder 30 may, in some examples, perform a decoding pass generally reciprocal to the encoding pass described with respect to video encoder 20 from FIG. 2.

During the decoding process, video decoder 30 receives an encoded video bitstream that represents video blocks of an encoded video slice and associated syntax elements from video encoder 20. When the represented video blocks in the bitstream include compressed video data, entropy decoding unit 80 of video decoder 30 entropy decodes the bitstream to generate quantized coefficients, motion vectors, and other syntax elements. Entropy decoding unit 80 forwards the motion vectors and other syntax elements to prediction processing unit 82. Video decoder 30 may receive the syntax elements at the video slice level and/or the video block level.

When the video slice is coded as an intra-coded (I) slice, intra-prediction processing unit 86 of prediction processing unit 82 may generate prediction data for a video block of the current video slice based on a signaled intra-prediction mode and data from previously decoded blocks of the current frame or picture. When the video frame is coded as an inter-coded (i.e., B, P or GPB) slice, motion compensation unit 84 of prediction processing unit 82 produces predictive blocks for a video block of the current video slice based on the motion vectors and other syntax elements received from entropy decoding unit 80. The predictive blocks may be produced from one of the reference pictures within one of the reference picture lists. Video decoder 30 may construct the reference frame lists, List 0 and List 1, using default construction techniques based on reference pictures stored in reference frame memory 96.

Motion compensation unit 84 determines prediction information for a video block of the current video slice by parsing the motion vectors and other syntax elements, and uses the prediction information to produce the predictive blocks for the current video block being decoded. For example, motion compensation unit 84 uses some of the received syntax elements to determine a prediction mode (e.g., intra- or inter-prediction) used to code the video blocks of the video slice, an inter-prediction slice type (e.g., B slice, P slice, or GPB slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 84 may also perform interpolation based on interpolation filters. Motion compensation unit 84 may use interpolation filters as used by video encoder 20 during encoding of the video blocks to calculate interpolated values for sub-integer pixels of reference blocks. Motion compensation unit 84 may determine the interpolation filters used by video encoder 20 from the received syntax elements and use the interpolation filters to produce predictive blocks.

Inverse quantization unit 88 inverse quantizes, i.e., de-quantizes, the quantized transform coefficients provided in the bitstream and decoded by entropy decoding unit 80. The inverse quantization process may include use of a quantization parameter (QP) calculated by video encoder 20 for each video block in the video slice to determine a degree of quantization and, likewise, a degree of inverse quantization that should be applied. Inverse transform processing unit 90 applies an inverse transform, e.g., an inverse DCT, an inverse integer transform, or a conceptually similar inverse transform process, to the transform coefficients in order to produce residual blocks in the pixel domain.

After motion compensation unit 84 generates the predictive block for the current video block based on the motion vectors and other syntax elements, video decoder 30 forms a decoded video block by summing the residual blocks from inverse transform processing unit 90 with the corresponding predictive blocks generated by motion compensation unit 84. Summer 92 represents the component or components that perform this summation operation. A deblocking filter is applied to filter the decoded blocks in order to remove blockiness artifacts. The decoded video blocks in a given frame or picture are then stored in reference frame memory 96, which stores reference pictures used for subsequent motion compensation. Reference frame memory 96 also stores decoded video for later presentation on a display device, such as display device 28 of FIG. 1.

In some examples, video decoder 30 may be configured to decode one or more blocks of video data during a video coding process, e.g., one or more encoded blocks of video data received in a bitstream from video encoder 20 and/or storage device 24. For example, as described above with reference to video encoder 20, the one or more blocks may be included within one or more slices of video data. As one example, entropy decoding unit 80 of video decoder 30 may be configured to decode a first syntax element, conforming to a particular type of syntax element, of a first slice of video data, conforming to a first slice type, using an initialization value set. In this example, entropy decoding unit 80 may be further configured to decode a second syntax element, conforming to the particular type of syntax element, of a second slice of video data, conforming to a second slice type, using the initialization value set. For example, as previously described, the first slice type may be different from the second slice type. As also previously described, at least one of the first slice type and the second slice type may be a temporally predicted slice type.

In some examples, entropy decoding unit 80 may be further configured to determine the initialization value set used to decode the first and second syntax elements based on at least one of: (1) the first slice type of the first slice of video data, and the second slice type of the second slice of video data; and (2) a first initialization indicator value for the first slice of video data, and a second initialization indicator value for the second slice of video data. In these examples, each of the first and second initialization indicator values for the first and second slices of video data may indicate a particular initialization value set used to code the corresponding slice of video data.

As one example, each of the first and second initialization indicator values for the first and second slices may indicate an initialization value set that was used by a video encoder (e.g., video encoder 20) to encode the corresponding slice. In this example, video decoder 30, and, in particular entropy decoding unit 80, may be configured to receive one or more of indications of (or data defining) the first and second slice types of the first and second slices, and the first and second initialization indicator values for the first and second slices, in a received bitstream. For example, for each of the first and second slices, video decoder 30 may be configured to receive the one or more of the indications and values described above in the received bitstream as one or more syntax elements associated with the corresponding slice.

In other examples, entropy decoding unit 80 may be further configured to determine a first mapping between one or more of the first slice type and a first initialization indicator value for the first slice of video data, and the initialization value set using a first mapping function of one or more mapping functions. In these examples, entropy decoding unit 80 may be still further configured to determine a second mapping between one or more of the second slice type and a second initialization indicator value for the second slice of video data, and the initialization value set using a second mapping function of the one or more mapping functions. In these examples, each of the first and second initialization indicator values for the first and second slices of video data may once again indicate a particular initialization value set used to code the corresponding slice of video data.

For example, video decoder 30, and, in particular entropy decoding unit 80, may be configured to receive one or more indications of (or data defining) the first and second mapping functions in a received bitstream. In this example, for each of the first and second slices, video decoder 30 may be configured to receive one or more indications of the corresponding one of the first and second mapping functions in the received bitstream as one or more syntax elements associated with the respective slice. Alternatively, video decoder 30 may be configured to receive one or more indications of (or data defining) the one or more mapping functions, including the first and second mapping functions, in their entirety, in the received bitstream, e.g., as one or more syntax elements associated with one or both of the first and second slices.

As one example, entropy decoding unit 80 (or another component or unit of video decoder 30) may be configured to decode one or more values representative of at least one of the first and second mapping functions (or the one or more mapping functions in their entirety) and the first and second initialization indicator values in at least one of a PPS, an SPS, an APS, a VPS, a slice header, a frame header, and a sequence header, associated with the video data (e.g., as encoded by video encoder 20 in the received bitstream). Additionally, as previously explained, in some examples, entropy decoding unit 80 may be further configured to decode one or more values representative of the first and second slice types of the first and second slices in the received bitstream (e.g., in a slice header associated with the video data).

Alternatively, as another example, entropy decoding unit 80 may be configured to determine, or infer, at least one of the first and second mapping functions (or the one or more mapping functions in their entirety) and the first and second initialization indicator values based on one or more of a QP, a frame resolution parameter, and a GOP structure parameter associated with the video data (i.e., side information associated with the first and second slices), and a user input. Additionally, in some examples, entropy decoding unit 80 may be further configured to determine, or infer, the first and second slice types of the first and second slices using side information associated with the first and second slices.

In some examples, entropy decoding unit 80 may be further configured to determine a subset of contexts of a full set of contexts used to decode each of the first and second slices. In these examples, the subset of contexts may include at least one or more contexts used to code the particular type of syntax element of the first and second syntax elements. Also in these examples, to decode the first and second syntax element using the initialization value set, entropy decoding unit 80 may be configured to initialize one or more contexts of the subset of contexts based on the initialization value set.

In the above-described examples, video decoder 30, and, in particular entropy decoding unit 80, may be configured to receive one or more indications of (or data defining) the subset of contexts in a received bitstream (e.g., as encoded by video encoder 20 in the received bitstream), or determine (or infer) the subset of contexts using side information associated with the video data (i.e., the first and second slices). As one example, in a similar manner as described above with reference to the one or more mapping functions and the first and second initialization indicator values, to determine the subset of contexts of the full set of contexts, entropy decoding unit 80 (or another component or unit of video decoder 30) may be configured to decode one or more values that indicate the contexts of the full set of contexts that are included in the subset of contexts in at least one of a PPS, an SPS, an APS, a VPS, a slice header, a frame header, and a sequence header, associated with the video data (e.g., as encoded by video encoder 20 in the received bitstream).

Alternatively, as another example, also in a similar manner as described above with reference to the one or more mapping functions and the first and second initialization indicator values, to determine the subset of contexts of the full set of contexts, entropy decoding unit 80 may be configured to determine, or infer, the contexts of the full set of contexts that are included in the subset of contexts based on one or more of a QP, a frame resolution parameter, and a GOP structure parameter associated with the video data (i.e., side information associated with the first and second slices), and a user input.

Furthermore, in some examples, to decode the first syntax element and the second syntax element using the initialization value set, entropy decoding unit 80 may be configured to determine an initial context state for each of one or more contexts that are used to code at least the particular type of syntax element of the first and second syntax elements based on the initialization value set and a corresponding one of the first and second slice types of the first and second slices of video data to which the respective syntax element belongs. In these examples, entropy decoding unit 80 may determine the initialization value set based on the first slice type of the first slice of video data, and the second slice type of the second slice of video data.

In the above-described examples, to determine the initial context state for each of the one or more contexts based on the initialization value set and the corresponding one of the first and second slice types, entropy decoding unit 80 may be configured to determine the respective initial context state based on one or more values of the initialization value set (e.g., one or more of the "m," "n," and "m8" values described above), a QP value (e.g., a particular QP value, sometimes referred to as an initialization QP, or iQP, value, associated with a corresponding one of the first and second slices), and a QP offset value (e.g., a dQP value) determined based on the corresponding one of the first and second slice types.

As previously described, in some examples, the initialization value set may include one of: (1) a slope value and a separate intersection value; and (2) a single value representing both the slope value and the intersection value. For example, the initialization value set may include at least one pair of the slope and intersection values, or at least one single value representing both the slope value and the intersection value, in some examples. As one example, the initialization value set may include one or more pairs of values, each including a slope value and a separate intersection value, which may be referred to as "m" and "n," respectively. As another example, the initialization value set may include one or more single values, each of which represents both a slope value and an intersection value, and which may be referred to as "m8."

As illustrated by the examples above, the techniques of this disclosure may enable video decoder 30 to decode multiple syntax elements (e.g., encoded by video encoder 20, and/or provided by storage device 24), each conforming to the same type of syntax element, for multiple slices of video data having different slice types using a context adaptive entropy coding process (e.g., a CABAC process) based on the same, or common, initialization value set. In some examples, the particular type of syntax element may be used to indicate values of one or more coefficients, or other syntax information, for one or more blocks of video data. Specifically, according to the disclosed techniques, video decoder 30 may use the initialization value set to determine initial context states for (i.e., initialize) one or more contexts of the context adaptive entropy coding process prior to decoding each of the multiple syntax elements using the contexts. As a result, the techniques disclosed herein may, in some cases, reduce complexity (e.g., simplify processing and/or storage resources, or reduce the usage thereof) of video decoder 30 used to decode the multiple syntax elements for the multiple slices of video data.

Additionally, the disclosed techniques may enable video decoder 30 to decode data, e.g., video data, more efficiently. For example, the techniques may enable video decoder 30 to initialize one or more contexts of a context adaptive entropy coding process (e.g., a CABAC process) used to decode the data based on slice type information associated with the data, or, alternatively, one or more initialization indicator values associated with the data. As a result, upon being initialized, the one or more contexts may include probability estimates that are more accurate relative to probability estimates determined using other context initialization techniques. As such, video decoder 30 may decode the data more efficiently (e.g., using fewer bits), compared to other techniques.

In this manner, video decoder 30 represents an example of a video coder configured to code a first syntax element, conforming to a particular type of syntax element, of a first slice of video data, conforming to a first slice type, using an initialization value set, and code a second syntax element, conforming to the particular type of syntax element, of a second slice of video data, conforming to a second slice type, using the initialization value set, wherein the first slice type is different from the second slice type, and wherein at least one of the first slice type and the second slice type is a temporally predicted slice type.

Figure 4:
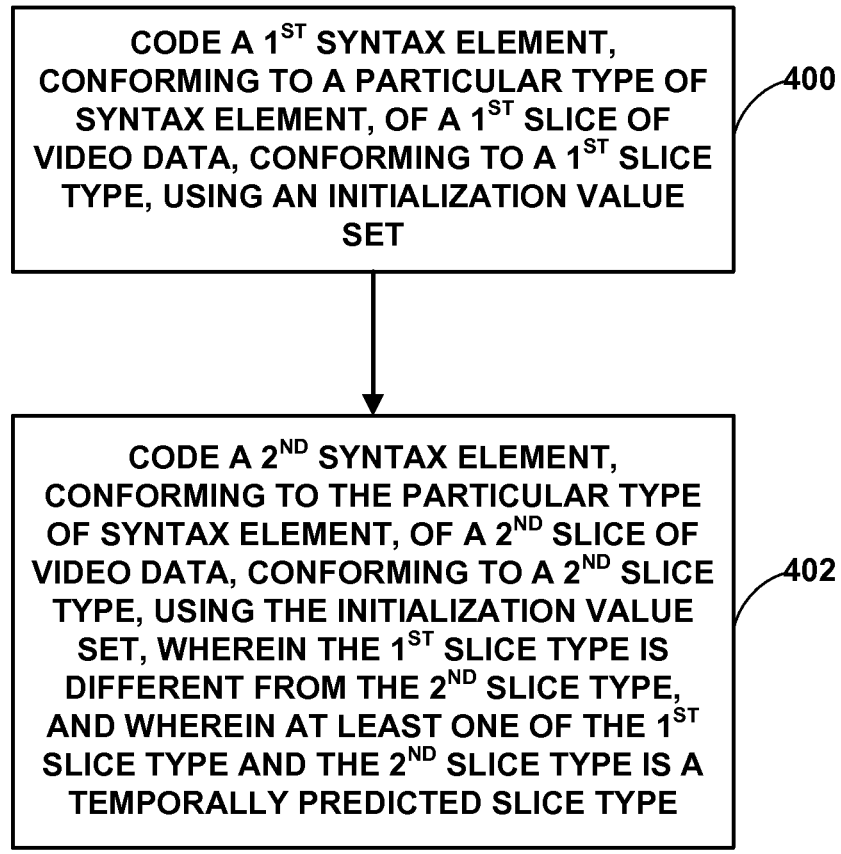
FIGS. 4-6 are flowcharts that illustrate example methods of context adaptive entropy coding with a reduced initialization value set, consistent with the techniques of this disclosure.
Figure 5:
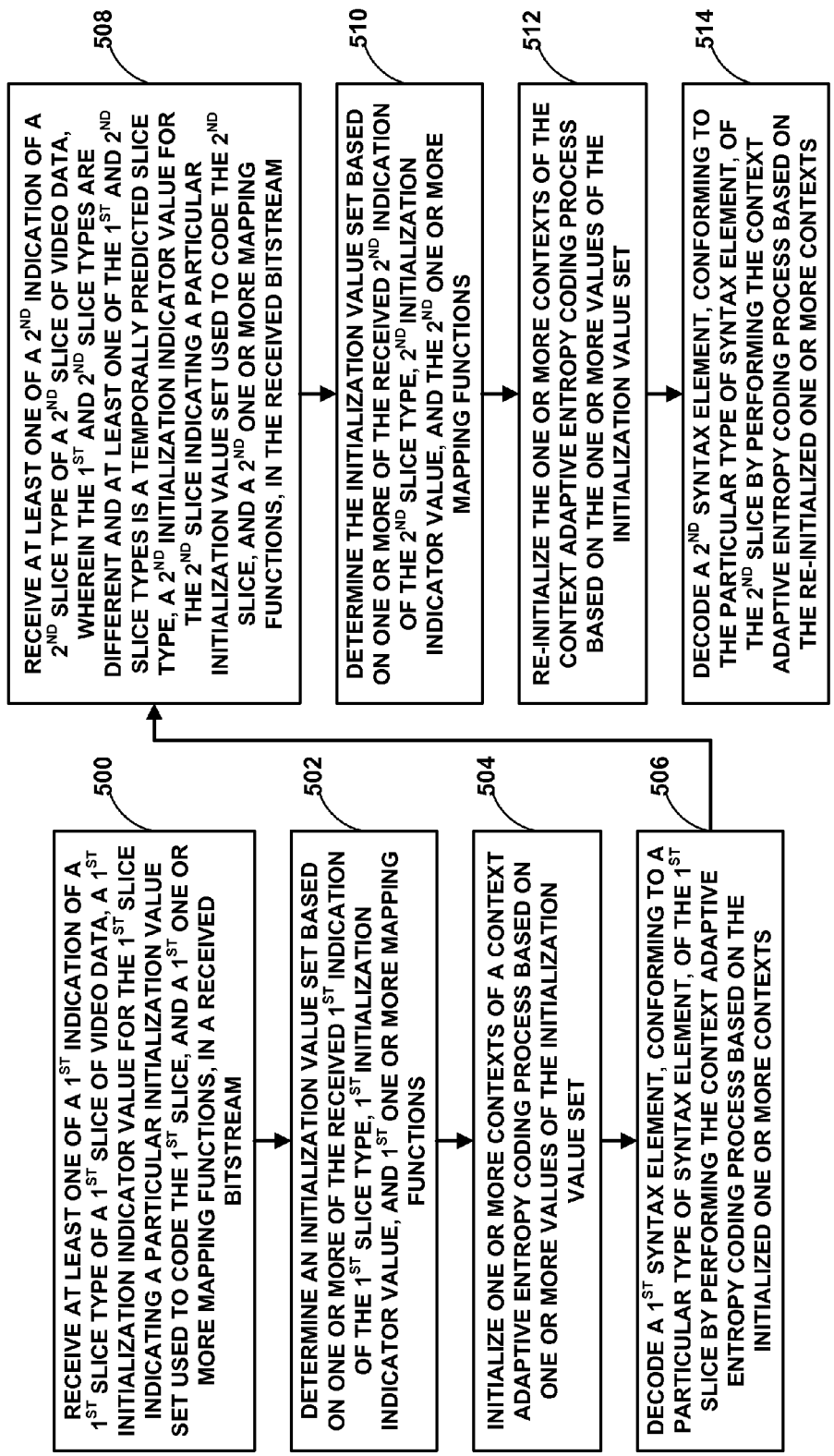
Figure 6:
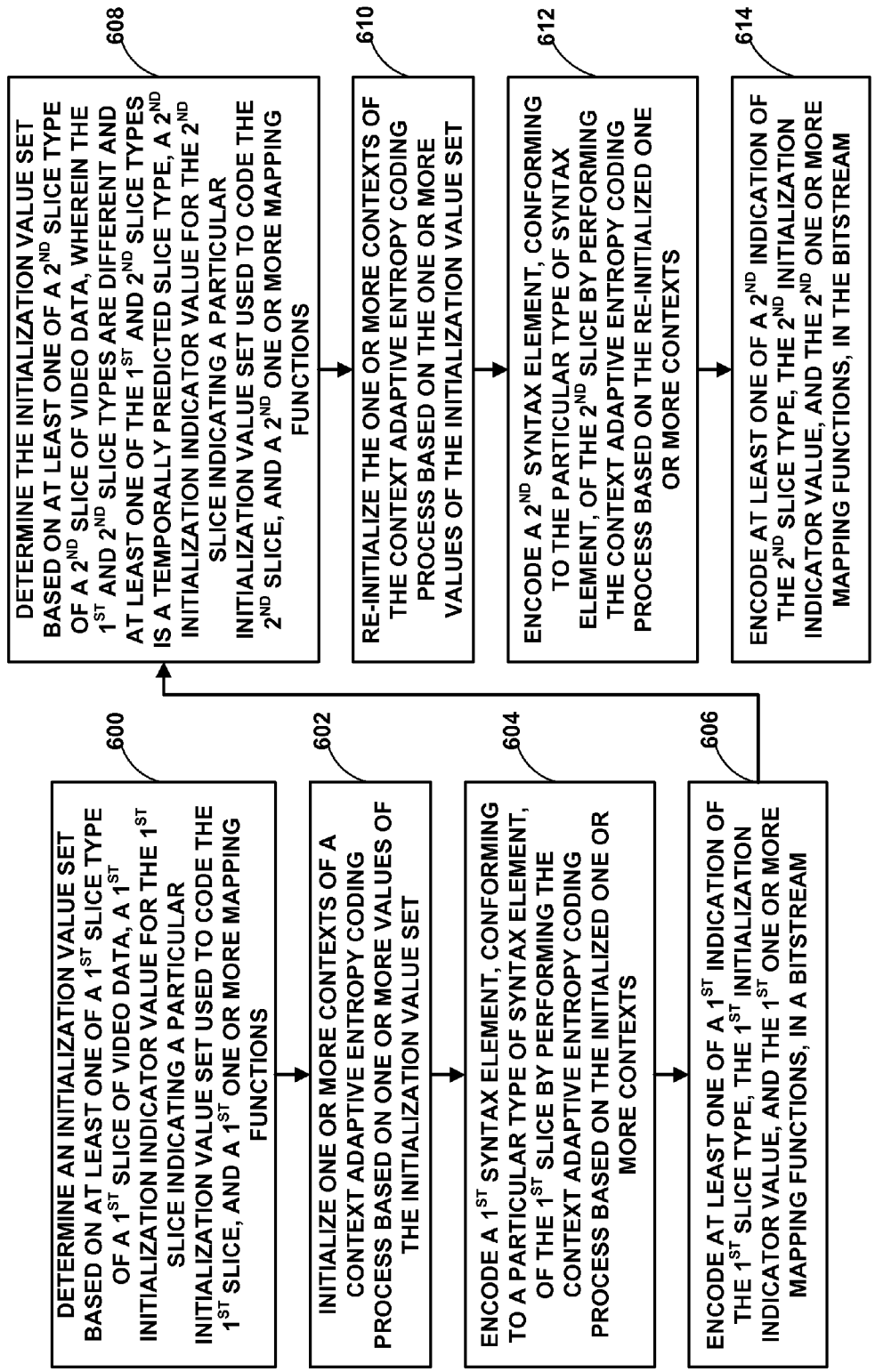
Figure 7:
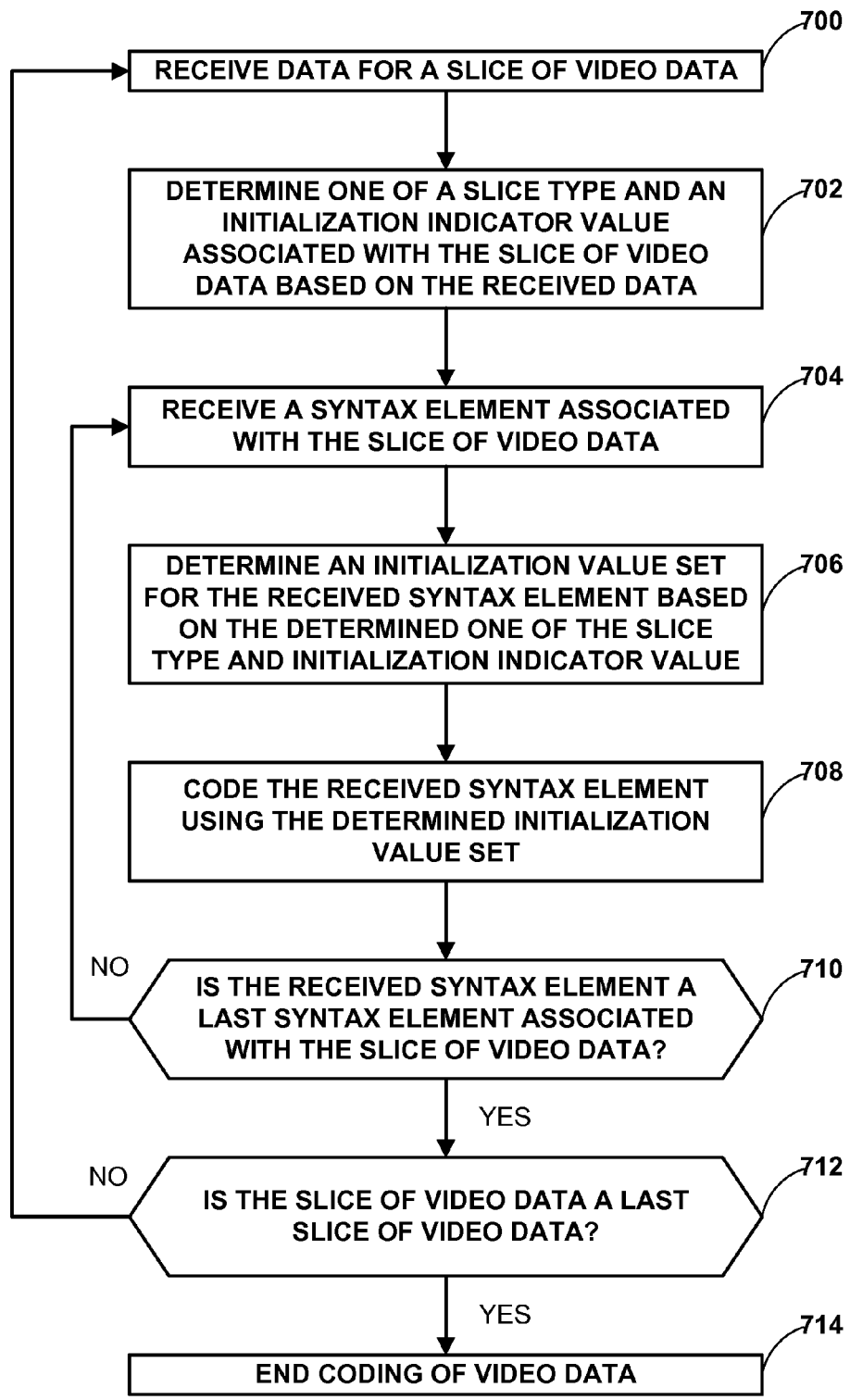
FIG. 7 is a flowchart that illustrates an example method of coding one or more syntax elements associated with one or more slices of video data, consistent with the techniques of this disclosure.

FIGS. 4-6 are flowcharts that illustrate example methods of context adaptive entropy coding with a reduced initialization set, consistent with the techniques of this disclosure. The techniques of FIGS. 4-6 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIGS. 4-6 are described with respect to both video encoder 20 (FIGS. 1 and 2) and video decoder 30 (FIGS. 1 and 3), as well as various components thereof (e.g., entropy encoding unit 56 and entropy decoding unit 80), although it should be understood that other devices may be configured to perform similar techniques. That is, video decoder 30 is generally configured to perform a reciprocal method, with respect to entropy coding, to that performed by video encoder 20. Therefore, video encoder 20 and video decoder 30, in this example, are configured to perform similar (albeit reciprocal) entropy coding methods. However, it should be understood that video encoders and/or video decoders may be individually configured to perform particular methods. Moreover, the steps illustrated in FIGS. 4-6 may be performed in a different order or in parallel, and additional steps may be added and certain steps omitted, without departing from the techniques of this disclosure.

Specifically, FIG. 4 illustrates an example method of context adaptive entropy coding with a reduced initialization set in the context of coding (i.e., encoding and/or decoding), generally, from the perspective of video encoder 20 and video decoder 30. That is, the description of FIG. 4 indicates both how video encoder 20 can perform the method, as well as how video decoder 30 can perform the method. Additionally, FIGS. 5 and 6 illustrate example methods of context adaptive binary arithmetic coding with a reduced initialization set in the context of decoding from the perspective of video decoder 30, and encoding from the perspective of video encoder 20, respectively.

As one example, video encoder 20 and/or video decoder 30 may code (i.e., encode and/or decode) one or more blocks of video data during a video coding process, as previously described. For example, the one or more blocks may be one or more PUs, TUs, or CUs, and may be included in one or more slices of video data, as also previously described. In this example, initially, video encoder 20 and/or video decoder 30 may code a first syntax element, conforming to a particular type of syntax element, of a first slice of video data, conforming to a first slice type, using an initialization value set (400).

For example, the particular type of syntax element of the first syntax element may correspond to any type of syntax element associated with the first slice. In some examples, the particular type of syntax element may be used to indicate values (e.g., magnitudes and/or signs) of one or more coefficients, as well as other syntax information (e.g., prediction information, including prediction mode and/or motion vector information) for one or more blocks of video data of the first slice. In other examples, the particular type of syntax element may be used to indicate various types of syntax information for the first slice itself (e.g., information that is common to multiple blocks of video data of the first slice). Additionally, in still other examples, the first slice type of the first slice may correspond to any one of a spatially-predicted "I-" slice type, and temporally-predicted "P-" and "B-" slice types, in a similar manner as described above with reference to FIGS. 1-3.

In this example, video encoder 20 and/or video decoder 30 may further code a second syntax element, conforming to the particular type of syntax element (i.e., to the same type of syntax element as that of the first syntax element described above), of a second slice of video data, conforming to a second slice type, using the initialization set. In this example, the first slice type may be different from the second slice type. Also in this example, at least one of the first slice type and the second slice type may be a temporally predicted slice type (402).

Stated another way, in this example, while the first slice type may correspond to any one of the spatially-predicted "I-" slice type and the temporally-predicted "P-" and "B-" slice types, as explained above, the second slice type of the second slice may correspond to any other one of the above-described slice types. In this manner, the first and second slice types may be different from one another. Additionally, also in this example, at least one of the first and second slices may be coded using temporal prediction. In other words, at least one of the first and second slice types described above may correspond to any one of the temporally-predicted "P-" and "B-" slice types. In this example, the other one of the first and second slices may be coded using temporal or spatial prediction (i.e., the other one of the first and second slice types may correspond to any one of the spatially-predicted "I-" slice type and the temporally-predicted "P-" and "B-" slice types).

In this manner, according to the techniques of this disclosure, video encoder 20 and/or video decoder 30 may code multiple syntax elements, each conforming to the same type of syntax element, for multiple slices of video data having different slice types using a context adaptive entropy coding process (e.g., a CABAC process) based on the same, or common, initialization value set. In some examples, the particular type of syntax element may be used to indicate values of one or more coefficients, or other syntax information, for one or more blocks of video data. Specifically, according to the disclosed techniques, video encoder 20 and/or video decoder 30 may use the initialization value set to determine initial context states for (i.e., "initialize") one or more contexts of the context adaptive entropy coding process prior to coding each of the multiple syntax elements using the contexts. As a result, the techniques disclosed herein may, in some cases, reduce complexity (e.g., simplify processing and/or storage resources, or reduce the usage thereof) of video encoder 20 and/or video decoder 30 used to code the multiple syntax elements for the multiple slices of video data.

In some examples, video encoder 20 and/or video decoder 30 may further determine the initialization value set used to code the first and second syntax elements based on at least one of: (1) the first slice type of the first slice of video data, and the second slice type of the second slice of video data, and (2) a first initialization indicator value for the first slice of video data, and a second initialization indicator value for the second slice of video data. In a similar manner as described above with reference to FIGS. 1-3, in this example, each of the first and second initialization indicator values for the first and second slices of video data may indicate a particular initialization value set used to code the corresponding slice of video data.

As one example, as described above, each of the first and second initialization indicator values for the first and second slices may be an integer value selected from a set of one or more integer values, e.g., a set that includes integer values ranging from "0" to "N−1," where "N" is some non-zero integer value. In this example, each integer value (e.g., 0, 1, 2 . . . N−1) included within the set may correspond to, or indicate, a particular initialization value set (e.g., Set(0), Set(1), Set(2) . . . Set(N−1)) of one or more initialization value sets. Additionally, as also described above, each of the first and second initialization indicator values for the first and second slices may be signaled in a bitstream (e.g., from video encoder 20 to video decoder 30) using a particular type of syntax element, such as, e.g., syntax element type cabac_init_idc, or another syntax element type. In some examples, video encoder 20 and/or video decoder 30 may code one or more of the first and second initialization indicator values using any of fixed length codes, variable length codes (e.g., using VLC, or similar techniques), or arithmetic codes (e.g., CABAC, PIPE, or similar techniques).

In this manner, in some examples, to code each of the first and second syntax elements, video encoder 20 and/or video decoder 30 may determine the initialization value set based on the corresponding one of the first and second initialization indicator values for the first and second slices to which the respective syntax element belongs. For example, video encoder 20 and/or video decoder 30 may select the initialization value set from a group of multiple initialization value sets based on the first and second initialization indicator values, e.g., in an adaptive manner and irrespective of the first and second slice types of the first and second slices.

As a result, video encoder 20 and/or video decoder 30 may code the first and second syntax elements more efficiently. For example, video encoder 20 and/or video decoder 30 may initialize one or more contexts of a context adaptive entropy coding process (e.g., a CABAC process) used to code the first and second syntax elements using the initialization value set determined in the manner described above. In particular, in this example, to code each of the first and second syntax elements, video encoder 20 and/or video decoder 30 may select the initialization value set irrespective of the corresponding one of the first and second slice types of the first and second slices to which the respective syntax element belongs. As such, upon being initialized using the initialization value set, the one or more contexts may include probability estimates that are more accurate relative to probability estimates determined using other context initialization techniques (e.g., techniques that select an initialization value set to code syntax elements of a slice of video data based on a slice type associated with the slice). In this manner, video encoder 20 and/or video decoder 30 may code the first and second syntax elements more efficiently (e.g., using fewer bits), compared to other techniques.

In other examples, however, as already described above, video encoder 20 and/or video decoder 30 may select the initialization value set from the group of multiple initialization value sets based on the first and second slice types.

In other examples, video encoder 20 and/or video decoder 30 may further determine a first mapping between one or more of the first slice type and a first initialization indicator value for the first slice of video data, and the initialization value set using a first mapping function of one or more mapping functions. In these examples, video encoder 20 and/or video decoder 30 may still further determine a second mapping between one or more of the second slice type and a second initialization indicator value for the second slice of video data, and the initialization value set using a second mapping function of the one or more mapping functions. In these examples, once again, each of the first and second initialization indicator values for the first and second slices of video data may indicate a particular initialization value set used to code the corresponding slice of video data.

In some examples, the one or more mapping functions and, when applicable, the first and second initialization indicator values, may be defined, or fixed, and may be available to both video encoder 20 and video decoder 30 for purposes of determining the initialization value set in the manner described above. In other examples, however, video encoder 20 may determine, or manipulate in some manner, at least one of the one or more mapping functions and the first and second initialization indicator values as part of encoding the first and second syntax elements. In these examples, video encoder 20 may further encode one or more values representative of at least one of the one or more mapping functions and the first and second initialization indicator values in at least one of a PPS, an SPS, an APS, a VPS, a slice header, a frame header, and a sequence header, associated with the video data.

For example, video encoder 20 may signal the encoded one or more values in a bitstream, such that video decoder 30 may receive the bitstream and decode the one or more values. Video encoder 20 may also signal the encoded first and second syntax elements in the bitstream. In these examples, based on the decoded one or more values, video decoder 30 may determine the at least one of the one or more mapping functions and the first and second initialization indicator values. Subsequently, video decoder 30 may determine the initialization value set based on the one or more mapping functions, and, when applicable, the first and second initialization indicator values. Video decoder 30 may receive the encoded first and second syntax elements in the bitstream, and decode the first and second syntax elements based on the determined initialization value set.

In other examples, video encoder 20 and/or video decoder 30 may further determine at least one of the one or more mapping functions and, when applicable, the first and second initialization indicator values, based on one or more of a QP, a frame resolution parameter, and a GOP structure parameter associated with the video data. In still other examples, video encoder 20 and/or video decoder 30 may determine the one or more mapping functions and first and second initialization indicator values based on other information (sometimes referred to as side information) that relates to one or more of the first and second slices. Additionally, in some examples, video encoder 20 and/or video decoder 30 may further determine the at least one of the one or more mapping functions and the first and second initialization indicator values based on a user input. In other words, in some examples, the one or more mapping functions, and, when applicable, the first and second initialization indicator values (e.g., allocation, or assignment, of the first and second initialization indicator values to the first and second slices), may be specified by a user.

In some examples, video encoder 20 and/or video decoder 30 may further determine the initialization value set based on one or more of the first and second slice types and a first initialization indicator value for the first slice of video data and a second initialization indicator value for the second slice of video data, in conjunction with one or more formulas. In these examples, once again, each of the first and second initialization indicator values for the first and second slices of video data may indicate a particular initialization value set used to code the corresponding slice of video data. For example, the one or more formulas may be defined, or fixed, and may be available to both video encoder 20 and video decoder 30 for purposes of determining the initialization value set in the manner described above. In other examples, however, video encoder 20 may encode one or more values indicative of the one or more formulas in a bitstream, and video decoder 30 may receive the encoded one or more values in the bitstream and decode the one or more values, for purposes of determining the initialization value set.

In some examples, video encoder 20 and/or video decoder 30 may further determine a subset of contexts of a full set of contexts used to code each of the first and second slices. In these examples, the subset of contexts may include at least one or more contexts used to code the particular type of syntax element of the first and second syntax elements. In other words, in some examples, the subset of contexts may include additional contexts. In any case, in these examples, to code the first and second syntax element using the initialization value set, video encoder 20 and/or video decoder 30 may initialize one or more contexts of the subset of contexts based on the initialization value set. In this manner, the initialization value set described above may apply to (i.e., be used to determine initial context states for, or "initialize") a limited number of contexts included within the subset of contexts, rather than all contexts of the full set of contexts used to code each of the first and second slices.

As one example, the subset of contexts may include at least one or more contexts used to code one or more types of syntax elements relating to coefficients, and/or to coding of coefficients, of one or more blocks of video data. For example, the one or more types of syntax elements may be used to indicate significant coefficient position and last significant coefficient position (e.g., "significance map") information, coefficient level (e.g., magnitude and sign) information, as well as other information used to code coefficients of blocks of video data. In some examples, the syntax element types may include "significant_coeff_flag," "last_significant_coeff_flag," "coeff_abs_level_minus1," "coeff_sign_flag," "larger_than_one_flag," and "larger_than_two_flag," as well as any number of other equivalent or similar syntax element types.

In some examples, video encoder 20 and/or video decoder 30 may further code one or more values that indicate the contexts of the full set of contexts that are included in the subset of contexts in at least one of a PPS, an SPS, an APS, a VPS, a slice header, a frame header, and a sequence header, associated with the video data, in a similar manner as described above with reference to the one or more mapping functions and the first and second initialization indicator values.

In other examples, to determine the subset of contexts of the full set of contexts, video encoder 20 and/or video decoder 30 may determine the contexts of the full set of contexts that are included in the subset of contexts based on one or more of a QP, a frame resolution parameter, and a GOP structure parameter associated with the video data. As another example, to determine the subset of contexts of the full set of contexts, video encoder 20 and/or video decoder 30 may determine the contexts of the full set of contexts that are included in the subset of contexts based on other information (sometimes referred to as side information) that relates to one or more of the first and second slices. Additionally, in some examples, to determine the subset of contexts of the full set of contexts, video encoder 20 and/or video decoder 30 may determine the contexts of the full set of contexts that are included in the subset of contexts based on a user input. In other words, in some examples, the subset of contexts (e.g., the contexts of the full set of contexts that are included in the subset of contexts), may be specified by a user.

In some examples, to code the first syntax element and the second syntax element using the initialization value set, video encoder 20 and/or video decoder 30 may determine an initial context state for each of one or more contexts that are used to code at least the particular type of syntax element of the first and second syntax elements. For example, video encoder 20 and/or video decoder 30 may determine the respective initial context state based on the initialization value set and a corresponding one of the first and second slice types of the first and second slices of video data to which the respective syntax element belongs. In these examples, video encoder 20 and/or video decoder 30 may determine the initialization value set based on the first slice type of the first slice of video data, and the second slice type of the second slice of video data. In these examples, to determine the initial context state for each of the one or more contexts based on the initialization value set and the corresponding one of the first and second slice types, video encoder 20 and/or video decoder 30 may determine the respective initial context state based on the following: (1) one or more values of the initialization value set (e.g., one or more of the "m," "n," and "m8" values described above); (2) a QP value (e.g., a particular QP value, sometimes referred to as an initialization QP, or iQP, value, associated with a corresponding one of the first and second slices), and a QP offset value (e.g., a dQP value) determined based on the corresponding one of the first and second slice types. For example, as described above, the QP offset value (e.g., dQP) may be used to modify, or "offset," the QP value (e.g., QP, or iQP) used to determine the respective initial context state (e.g., InitState), as illustrated in expressions EQ. 4 and 5 reproduced below:

$$\text{Int } i\text{InitState} = ((m^*(i\text{Qp}+d\text{QP}))/16)+n; \quad \text{EQ. 4}$$

$$i\text{InitState} = \min(\max(1, i\text{InitState}), 126) \quad \text{EQ. 5}$$

As a result, video encoder 20 and/or video decoder 30 may code the first and second syntax elements more efficiently. For example, video encoder 20 and/or video decoder 30 may initialize one or more contexts of a context adaptive entropy coding process (e.g., a CABAC process) used to code the first and second syntax elements using the initialization value set (i.e., the same initialization value set determined based on the first and second slice types of the first and second slices), as well as the corresponding one of the first and second slice types, in the manner described above. As such, upon being initialized using the initialization value set and the first and second slice types, the one or more contexts may include probability estimates that are more accurate relative to probability estimates determined using other context initialization techniques. Specifically, the above-described techniques may enable video encoder 20 and/or video decoder 30 to code both the first and second syntax elements using the same initialization value set, potentially reducing the complexity of video encoder 20 and/or video decoder 30, as well as using slice type information associated with the respective syntax element, potentially improving accuracy of initial context states determined using the initialization value set.

In this manner, video encoder 20 and/or video decoder 30 may code the first and second syntax elements more efficiently (e.g., using fewer bits) compared to other techniques, while potentially reducing the complexity of video encoder 20 and/or video decoder 30 used to code the first and second syntax elements, as already described above.

As previously described, in some examples, each of the first and second slice types may be one of an intra-prediction (I) slice type, a unidirectional inter-prediction (P) slice type, and a bi-directional inter-prediction (B) slice type. For example, as explained above, one of the first and second slice types may be any one the (I), (B), and (P) slice types, while the other one of the first and second slice types may be any other one of the above-described slice types (i.e., the first and second slice types may be different from one another). Additionally, as also explained above, at least one of the first and second slice types may be a temporally predicted slice type (i.e., one of the (P) and (B) slice types).

Furthermore, as also previously described, in some examples, the initialization value set may include one of: (1) a slope value and a separate intersection value, and (2) a single value representing both the slope value and the intersection value. As one example, in a similar manner as described above with reference to HM 4.0, the initialization value set may include one or more pairs of values, wherein each pair of values includes a slope value and a separate intersection value, which may be referred to as "m" and "n," respectively. As another example, in a similar manner as described above with reference to HM 5.0, the initialization value set may include one or more single values, which may be referred to as "m8", wherein each single value represents both a slope value and an intersection value.

As another example, video decoder 30 may receive at least one of a first indication of (or data defining) a first slice type of a first slice of video data, a first initialization indicator value for the first slice indicating a particular initialization value set used to code the first slice, and a first one or more mapping functions, in a received bitstream (500). In this example, the above-described syntax information for the first slice (i.e., the first indication of the first slice type, the first initialization indicator value, and the first one or more mapping functions) may be encoded within the received bitstream by video encoder 20, as described below with reference to the example of FIG. 6. For example, video encoder 20 may generate the bitstream for transmission to video decoder 30, and/or for storage within storage device 24. Also in this example, video decoder 30 may further determine an initialization value set based on one or more of the received first indication of the first slice type, first initialization indicator value, and first one or more mapping functions (502). For example, video decoder 30 may map the first slice type or, when applicable, the first initialization indicator value, to the initialization value set using the first one or more mapping functions. In other words, using the first one or more mapping functions, video decoder 30 may select the initialization value set, e.g., from among a number of initialization value sets, using the first slice type or, when applicable, the first initialization indicator value.

After determining, or selecting, the initialization value set, video decoder 30 may initialize one or more contexts of a context adaptive entropy coding process (e.g., a CABAC process) based on one or more values of the initialization value set (504). For example, video decoder 30 may determine initial context states, corresponding to initial probabilities, for each of the one or more contexts using the one or more values of the initialization value set. Video decoder 30 may then decode a first syntax element, conforming to a particular type of syntax element, of the first slice by performing the context adaptive entropy coding process based on the initialized one or more contexts (506).

Subsequently, video decoder 30 may receive at least one of a second indication of (or data defining) a second slice type of a second slice of video data, a second initialization indicator value for the second slice indicating a particular initialization value set used to code the second slice, and a second one or more mapping functions, in the received bitstream (508). In this example, the first and second slice types may be different, and at least one of the first and second slice types may be a temporally predicted slice type (e.g., a "P-" slice type, or a "B-" slice type), as previously described with reference to the example of FIG. 4.

In this example, the above-described syntax information for the second slice (i.e., the second indication of the second slice type, the second initialization indicator value, and the second one or more mapping functions) may once again be encoded within the received bitstream by video encoder 20, as described below with reference to the example of FIG. 6. As previously explained, in some examples, video encoder 20 may generate the bitstream for transmission to video decoder 30, and/or for storage within storage device 24.

Also in this example, video decoder 30 may further determine the initialization value set based on one or more of the received second indication of the second slice type, second initialization indicator value, and second one or more mapping functions (510). For example, video decoder 30 may once again map the second slice type or, when applicable, the second initialization indicator value, to the initialization value set using the second one or more mapping functions. Stated another way, using the second one or more mapping functions, video decoder 30 may select the initialization value set, e.g., from among a number of initialization value sets, using the second slice type or, when applicable, the second initialization indicator value.

After determining, or selecting, the initialization value set, video decoder 30 may once again initialize, or "re-initialize," the one or more contexts of the context adaptive entropy coding process based on the one or more values of the initialization value set (512). For example, video decoder 30 may once again determine initial context states, corresponding to initial probabilities, for each of the one or more contexts using the one or more values of the initialization value set. Video decoder 30 may then decode a second syntax element, conforming to the particular type of syntax element (i.e., the same type of syntax element as that of the first syntax element), of the second slice by performing the context adaptive entropy coding process based on the re-initialized one or more contexts (514). In the above-described example, the first and second indications of the first and second slice types may correspond to the same value of a particular syntax element type used to indicate a slice type associated with a slice of video data. For example, the same value of the particular syntax element may be associated with each of the first and second slices. Similarly, when applicable, the first and second initialization indicator values for the first and second slices may also correspond to the same value of a particular syntax element type, e.g., cabac_init_idc, associated with each of the first and second slices. Furthermore, the first and second one or more mapping functions may be the same one or more mapping functions. In this manner, video decoder 30 may map each of the first and second slice types or, when applicable, each of the first and second initialization indicator values, to the initialization value set using the first and second one or more mapping functions.

As still another example, video encoder 20 may determine an initialization value set based on at least one of a first slice type of a first slice of video data, a first initialization indicator value for the first slice indicating a particular initialization value set used to code the first slice, and a first one or more mapping functions (600). In this example, the above-described syntax information for the first slice (i.e., the first indication of the first slice type, the first initialization indicator value, and the first one or more mapping functions) may be generated by video encoder 20 (e.g., as part of encoding the first slice), or provided to video encoder 20 by another system or device. For example, video encoder 20 may encode this syntax information within a bitstream to be received by video decoder 30, as described above with reference to the example of FIG. 5. In some examples, video encoder 20 may generate the bitstream for transmission to video decoder 30, and/or for storage within storage device 24.

In this example, video encoder 20 may map the first slice type or, when applicable, the first initialization indicator value, to the initialization value set using the first one or more mapping functions. In other words, using the first one or more mapping functions, video encoder 20 may select the initialization value set, e.g., from among a number of initialization value sets, using the first slice type or, when applicable, the first initialization indicator value.

After determining, or selecting, the initialization value set, video encoder 20 may initialize one or more contexts of a context adaptive entropy coding process (e.g., a CABAC process) based on one or more values of the initialization value set (602). For example, video encoder 20 may determine initial context states, corresponding to initial probabilities, for each of the one or more contexts using the one or more values of the initialization value set. Video encoder 20 may then encode a first syntax element, conforming to a particular type of syntax element, of the first slice by performing the context adaptive entropy coding process based on the initialized one or more contexts (604). Additionally, video encoder 20 may encode at least one of a first indication of (or data defining) the first slice type, the first initialization indicator value, and the first one or more mapping functions, in a bitstream (606). For example, video encoder 20 may encode the above-described syntax information in the bitstream for use by video decoder 30, as described above with reference to the example of FIG. 5, and/or for storage within storage device 24.

Subsequently, video encoder 20 may determine the initialization value set based on at least one of a second slice type of a second slice of video data, a second initialization indicator value for the second slice indicating a particular initialization value set used to code the second slice, and a second one or more mapping functions (608). In this example, the first and second slice types may be different, and at least one of the first and second slice types may be a temporally predicted slice type (e.g., a "P-" slice type, or a "B-" slice type), as previously described with reference to the example of FIG. 4.

In this example, the above-described syntax information for the second slice (i.e., the second indication of the second slice type, the second initialization indicator value, and the second one or more mapping functions) may once again be generated by video encoder 20 (e.g., as part of encoding the second slice), or provided to video encoder 20 by another system or device. For example, video encoder 20 may once again encode this syntax information within a bitstream to be received by video decoder 30, as described above with reference to the example of FIG. 5. As previously explained, in some examples, video encoder 20 may generate the bitstream for transmission to video decoder 30, and/or for storage within storage device 24.

Also in this example, video encoder 20 may once again map the second slice type or, when applicable, the second initialization indicator value, to the initialization value set using the second one or more mapping functions. In other words, using the second one or more mapping functions, video encoder 20 may select the initialization value set, e.g., from among a number of initialization value sets, using the second slice type or, when applicable, the second initialization indicator value.

After determining, or selecting, the initialization value set, video encoder 20 may initialize, or re-initialize, the one or more contexts of the context adaptive entropy coding process based on the one or more values of the initialization value set (610). For example, video encoder 20 may once again determine initial context states, corresponding to initial probabilities, for each of the one or more contexts using the one or more values of the initialization value set. Video encoder 20 may then encode a second syntax element, conforming to the particular type of syntax element (i.e., the same type of syntax element as that of the first syntax element), of the second slice by performing the context adaptive entropy coding process based on the re-initialized one or more contexts (612). Additionally, video encoder 20 may encode at least one of a second indication of (or data defining) the second slice type, the second initialization indicator value, and the second one or more mapping functions, in the bitstream (614). For example, video encoder 20 may encode the above-described syntax information in the bitstream for use by video decoder 30, as described above with reference to the example of FIG. 5, and/or for storage within storage device 24.

In the above-described example, the first and second indications of the first and second slice types may once again correspond to the same value of a particular syntax element type used to indicate a slice type associated with a slice of video data. For example, the same value of the particular syntax element may be associated with each of the first and second slices. Similarly, when applicable, the first and second initialization indicator values for the first and second slices may also correspond to the same value of a particular syntax element type, e.g., cabac_init_idc, associated with each of the first and second slices. Furthermore, the first and second one or more mapping functions may be the same one or more mapping functions. In this manner, like video decoder 30, video encoder 20 may map each of the first and second slice types or, when applicable, each of the first and second initialization indicator values, to the initialization value set using the first and second one or more mapping functions. As still another example, video encoder 20 and/or video decoder 30 may receive data for a slice of video data (700). For example, the slice of video data may be a currently coded slice. In this example, the data for the currently coded slice may include one or more syntax elements associated with the slice. As one example, the one or more syntax elements may indicate various types of information about the currently coded slice, including various types of control information used by a video encoder (e.g., video encoder 20) to encode the slice, and required for a video decoder (e.g., video decoder 30) to decode the slice.

In this example, video encoder 20 and/or video decoder 30 may further determine one of a slice type and an initialization indicator value associated with the slice of video data based on the received data (702). For example, the determined slice type associated with the currently coded slice may be any of the "I," "P," and "B" slice types described above. In this example, the determined slice type may be represented using a syntax element associated with the currently coded slice. As another example, the determined initialization indicator value associated with the currently coded slice may also be represented using a syntax element, e.g., conforming to a particular syntax element type. For example, the determined initialization indicator value may be a value of syntax element type cabac_init_idc, or of another similar syntax element type, associated with the currently coded slice. In this example, the initialization indicator value associated with the currently coded slice may indicate a particular initialization value set used to code the slice.

Also in this example, video encoder 20 and/or video decoder 30 may still further receive a syntax element associated with the slice of video data (704). For example, the syntax element associated with the currently coded slice may be a currently coded syntax element for the slice. As one example, the syntax element may correspond to a syntax element type used to represent coefficient information for the currently coded slice (e.g., coefficient value information, or related syntax information, for one or more blocks of video data of the slice).

In this example, video encoder 20 and/or video decoder 30 may still further determine an initialization value set for the received syntax element based on the determined one of the slice type and initialization indicator value (706). For example, as previously explained, the initialization value set may include one or more initialization values (e.g., one or more of the "m," "n," and "m8" values described above) that may be used to determine an initial context state for (or "initialize") each of one or more contexts of a context adaptive entropy coding process (e.g., a CABAC process).

As one example, video encoder 20 and/or video decoder 30 may determine the initialization value set for the received syntax element by mapping the determined slice type associated with the currently coded slice to the initialization value set using one or more mapping functions. As another example, video encoder 20 and/or video decoder 30 may determine the initialization value set for the received syntax element independently of a slice type associated with the currently coded slice. For example, as previously described, video encoder 20 and/or video decoder 30 may determine the initialization value set using a value (i.e., an initialization indicator value) of a syntax element type cabac_init_idc associated with the currently coded slice. In any case, as a result of video encoder 20 and/or video decoder 30 determining the initialization value set for the received syntax element in the manner described above, video encoder 20 and/or video decoder 30 may determine the same initialization value set for multiple slices of video data, including slices that have different slice types.

Subsequently, video encoder 20 and/or video decoder 30 may code the received syntax element using the determined initialization value set (708). In particular, video encoder 20 and/or video decoder 30 may initialize one or more contexts of a context adaptive entropy coding process (e.g., a CABAC process) used to code the received syntax element (e.g., one or more contexts used to code a particular syntax element type that corresponds to the received syntax element) using the determined initialization value set, and code the received syntax element using the initialized one or more contexts.

In the event the received syntax element is not a last syntax element associated with the currently coded slice (e.g., additional syntax elements of the currently coded slice exist) ("NO" branch of 710), video encoder 20 and/or video decoder 30 may perform steps (704)-(708) for another syntax element associated with the currently coded slice, in the same or a substantially similar manner as described above with respect to the currently coded syntax element.

However, in the event the received syntax element is the last syntax element associated with the currently coded slice (e.g., no additional syntax elements of the currently coded slice exist) ("YES" branch of 710), video encoder 20 and/or video decoder 30 may further determine whether syntax elements of another slice of video data are available to be coded, as described in greater detail below.

For example, in the event the currently coded, or "current," slice is not a last slice of video data (e.g., additional slices of a frame, or a sequence of frames, or "pictures," of video data being coded by video encoder 20 and/or video decoder 30 exist) ("NO" branch of 712), video encoder 20 and/or video decoder 30 may proceed to perform steps (700)-(710) for another, subsequently coded, or "next," slice of video data, in the same or a substantially similar manner as described above with respect to the currently coded slice.

Alternatively, in the event the currently coded slice is the last slice of video data (e.g., a last slice of a frame, or a sequence of frames, or pictures, of video data being coded by video encoder 20 and/or video decoder 30) ("YES" branch of 712), however, video encoder 20 and/or video decoder 30 may end coding of video data (714). In some examples, video encoder 20 and/or video decoder 30 may proceed to perform other tasks, such as transmitting (or "signaling"), storing, and/or displaying the coded video data to a user using one or more display devices.

In this manner, the methods of FIGS. 4-7 represent examples of methods that include coding a first syntax element, conforming to a particular type of syntax element, of a first slice of video data, conforming to a first slice type, using an initialization value set, and coding a second syntax element, conforming to the particular type of syntax element, of a second slice of video data, conforming to a second slice type, using the initialization value set, wherein the first slice type is different from the second slice type, and wherein at least one of the first slice type and the second slice type is a temporally predicted slice type.

In one or more examples, the functions described herein may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which may correspond to tangible or non-transitory media, such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium, such as a signal or carrier wave. Data storage media may be any available media that can be accessed by one or more computers or one or more processors to retrieve instructions, code, and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient or non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more general purpose microprocessors, DSPs, ASICs, FPGAs, or other equivalent integrated or discrete logic circuitry. Accordingly, the term "processor," as used herein, may refer to any of the foregoing structure or any other structure suitable for implementation of the techniques described in this disclosure. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an IC or a set of ICs (e.g., a chip set). Various components, modules, or units are described in this disclosure to emphasize functional aspects of devices configured to perform the disclosed techniques, but do not necessarily require realization by different hardware components, modules, or units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of coding video data, the method comprising:
   selecting an initialization value set for coding a first syntax element, conforming to a particular type of syntax element, of a first slice of video data based on a mapping of a slice type of the first slice of video data to the initialization value set;
   coding the first syntax element using the initialization value set;
   selecting the initialization value set for coding a second syntax element conforming to the particular type of syntax element of a second slice of video data based on a mapping of a second slice type of the second slice of video data to the initialization value set, wherein the second slice type is different from the first slice type, and wherein at least one of the first slice type and the second slice type is a temporally predicted slice type; and
   coding the second syntax element using the initialization value set.

2. The method of claim 1, further comprising:
   determining a second initialization value set for coding a third syntax element of a third slice of video data based on an initialization indicator value for the third slice of video data; and
   coding the third syntax element using the second initialization value set.

3. The method of claim 1, further comprising:
   determining a first mapping between one or more of the first slice type and a first initialization indicator value for the first slice of video data, and the initialization value set using a first mapping function of one or more mapping functions; and
   determining a second mapping between one or more of the second slice type and a second initialization indicator value for the second slice of video data, and the initialization value set using a second mapping function of the one or more mapping functions,
   wherein each of the first and second initialization indicator values for the first and second slices of video data indicates a particular initialization value set used to code the corresponding slice of video data.

4. The method of claim 3, further comprising coding one or more values representative of at least one of the one or more mapping functions and the first and second initialization indicator values in at least one of a picture parameter set (PPS), a sequence parameter set (SPS), an adaptation parameter set (APS), a video parameter set (VPS), a slice header, a frame header, and a sequence header, associated with the video data.

5. The method of claim 3, further comprising determining at least one of the one or more mapping functions and the first and second initialization indicator values based on one or more of a quantization parameter (QP), a frame resolution parameter, and a group-of-pictures (GOP) structure parameter associated with the video data, and a user input.

6. The method of claim 1, wherein coding the first syntax element and the second syntax element using the initialization value set comprises determining an initial context state for each of one or more contexts that are used to code at least the particular type of syntax element of the first and second syntax elements based on the initialization value set and a corresponding one of the first and second slice types of the first and second slices of video data to which the respective syntax element belongs.

7. The method of claim 6, wherein determining the initial context state for each of the one or more contexts based on the initialization value set and the corresponding one of the first and second slice types comprises determining the respective initial context state based on one or more values of the initialization value set, a quantization parameter (QP) value, and a QP offset value determined based on the corresponding one of the first and second slice types.

8. The method of claim 1, wherein each of the first and second slice types comprises one of an intra-prediction (I) slice type, a unidirectional inter-prediction (P) slice type, and a bi-directional inter-prediction (B) slice type.

9. The method of claim 1, wherein the initialization value set comprises one of:
  a slope value and a separate intersection value; and
  a single value representing both the slope value and the intersection value.

10. The method of claim 1, wherein coding comprises decoding, and wherein decoding the first and second syntax elements using the initialization value set includes:
  receiving at least one of the first and second slice types, first and second initialization indicator values for the first and second slices of video data, and one or more mapping functions, in a received bitstream;
  determining the initialization value set based on one or more of the received first and second slice types, first and second initialization indicator values, and one or more mapping functions;
  initializing one or more contexts of a context adaptive entropy coding process based on one or more values of the initialization value set; and
  decoding the first and second syntax elements by performing the context adaptive entropy coding process based on the initialized one or more contexts.

11. The method of claim 1, wherein coding comprises encoding, and wherein encoding the first and second syntax elements using the initialization value set includes:
  determining the initialization value set based on at least one of the first and second slice types, first and second initialization indicator values for the first and second slices of video data, and one or more mapping functions;
  initializing one or more contexts of a context adaptive entropy coding process based on one or more values of the initialization value set;
  encoding the first and second syntax elements by performing the context adaptive entropy coding process based on the initialized one or more contexts; and
  encoding at least one of the first and second slice types, first and second initialization indicator values for the first and second slices of video data, and one or more mapping functions, in a bitstream.

12. The method of claim 1, the method being executable on a wireless communication device, wherein the device comprises:
  a memory configured to store the first slice of video data and the second slice of video data;
  a processor configured to execute instructions to process the first slice of video data and the second slice of video data; and
  a receiver configured to receive the first slice of video data and the second slice of video data.

13. The method of claim 12, wherein the wireless communication device is a cellular telephone and the first slice of video data and the second slice of video data are received by the receiver and modulated according to a cellular communication standard.

14. An apparatus configured to code video data, the apparatus comprising:
  a memory configured to store a first slice of data and a second slice of video data; and
  a video coder configured to:
    select an initialization value set for coding a first syntax element, conforming to a particular type of syntax element, of a first slice of video data based on a mapping of a slice type of the first slice of video data to the initialization value set;
    code the first syntax element using the initialization value set;
    select the initialization value set for coding a second syntax element conforming to the particular type of syntax element of a second slice of video data based on a mapping of a second slice type of the second slice of video data to the initialization value set, wherein the second slice type is different from the first slice type, and wherein at least one of the first slice type and the second slice type is a temporally predicted slice type; and
    code the second syntax element using the initialization value set.

15. The apparatus of claim 14, wherein the video coder is further configured to:
  determine a second initialization value set for coding a third syntax element of a third slice of video data based on an initialization indicator value for the third slice of video data; and
  code the third syntax element using the second initialization value set.

16. The apparatus of claim 14, wherein the video coder is further configured to:
  determine a first mapping between one or more of the first slice type and a first initialization indicator value for the first slice of video data, and the initialization value set using a first mapping function of one or more mapping functions; and
  determine a second mapping between one or more of the second slice type and a second initialization indicator value for the second slice of video data, and the initialization value set using a second mapping function of the one or more mapping functions,
  wherein each of the first and second initialization indicator values for the first and second slices of video data indicates a particular initialization value set used to code the corresponding slice of video data.

17. The apparatus of claim 16, wherein the video coder is further configured to code one or more values representative of at least one of the one or more mapping functions and the first and second initialization indicator values in at least one of a picture parameter set (PPS), a sequence parameter set (SPS), an adaptation parameter set (APS), a video parameter set (VPS), a slice header, a frame header, and a sequence header, associated with the video data.

18. The apparatus of claim 16, wherein the video coder is further configured to determine at least one of the one or more mapping functions and the first and second initialization indicator values based on one or more of a quantization parameter (QP), a frame resolution parameter, and a group-of-pictures (GOP) structure parameter associated with the video data, and a user input.

19. The apparatus of claim 14, wherein to code the first syntax element and the second syntax element using the initialization value set, the video coder is configured to determine an initial context state for each of one or more contexts that are used to code at least the particular type of syntax element of the first and second syntax elements based on the initialization value set and a corresponding one of the first and second slice types of the first and second slices of video data to which the respective syntax element belongs.

20. The apparatus of claim 19, wherein to determine the initial context state for each of the one or more contexts based on the initialization value set and the corresponding one of the first and second slice types, the video coder is configured to determine the respective initial context state based on one or more values of the initialization value set, a quantization parameter (QP) value, and a QP offset value determined based on the corresponding one of the first and second slice types.

21. The apparatus of claim 14, wherein the initialization value set comprises one of:
a slope value and a separate intersection value; and
a single value representing both the slope value and the intersection value.

22. The apparatus of claim 14, wherein the apparatus comprises at least one of:
an integrated circuit;
a microprocessor; and
a wireless communication device that includes the video coder.

23. The apparatus of claim 14, wherein the device is a wireless communication device, further comprising a receiver configured to receive the first slice of video data and the second slice of video data.

24. The apparatus of claim 23, wherein the wireless communication device is a cellular telephone and the first slice of video data and the second slice of video data are received by the receiver and modulated according to a cellular communication standard.

25. A device configured to code video data, the device comprising:
means for selecting an initialization value set for coding a first syntax element, conforming to a particular type of syntax element, of a first slice of video data based on a mapping of a slice type of the first slice of video data to the initialization value set;
means for coding the first syntax element using the initialization value set;
means for selecting the initialization value set for coding a second syntax element conforming to the particular type of syntax element of a second slice of video data based on a mapping of a second slice type of the second slice of video data to the initialization value set, wherein the second slice type is different from the first slice type, and wherein at least one of the first slice type and the second slice type is a temporally predicted slice type; and
means for coding the second syntax element using the initialization value set.

26. The device of claim 25, further comprising:
means for determining a second initialization value set for coding a third syntax element of a third slice of video data based on an initialization indicator value for the third slice of video data; and
means for coding the third syntax element using the second initialization value set.

27. The device of claim 25, further comprising:
means for determining a first mapping between one or more of the first slice type and a first initialization indicator value for the first slice of video data, and the initialization value set using a first mapping function of one or more mapping functions; and
means for determining a second mapping between one or more of the second slice type and a second initialization indicator value for the second slice of video data, and the initialization value set using a second mapping function of the one or more mapping functions,
wherein each of the first and second initialization indicator values for the first and second slices of video data indicates a particular initialization value set used to code the corresponding slice of video data.

28. The device of claim 27, further comprising means for coding one or more values representative of at least one of the one or more mapping functions and the first and second initialization indicator values in at least one of a picture parameter set (PPS), a sequence parameter set (SPS), an adaptation parameter set (APS), a video parameter set (VPS), a slice header, a frame header, and a sequence header, associated with the video data.

29. The device of claim 27, further comprising means for determining at least one of the one or more mapping functions and the first and second initialization indicator values based on one or more of a quantization parameter (QP), a frame resolution parameter, and a group-of-pictures (GOP) structure parameter associated with the video data, and a user input.

30. The device of claim 25, wherein the means for coding the first syntax element and the second syntax element using the initialization value set comprises means for determining an initial context state for each of one or more contexts that are used to code at least the particular type of syntax element of the first and second syntax elements based on the initialization value set and a corresponding one of the first and second slice types of the first and second slices of video data to which the respective syntax element belongs.

31. The device of claim 30, wherein the means for determining the initial context state for each of the one or more contexts based on the initialization value set and the corresponding one of the first and second slice types comprises means for determining the respective initial context state based on one or more values of the initialization value set, a quantization parameter (QP) value, and a QP offset value determined based on the corresponding one of the first and second slice types.

32. The device of claim 25, wherein the initialization value set comprises one of:
a slope value and a separate intersection value; and
a single value representing both the slope value and the intersection value.

33. A non-transitory computer-readable storage medium storing instructions that, when executed, cause one or more processors to code video data, wherein the instructions cause the one or more processors to:
select an initialization value set for coding a first syntax element, conforming to a particular type of syntax element, of a first slice of video data based on a mapping of a slice type of the first slice of video data to the initialization value set;
code the first syntax element using the initialization value set;
select the initialization value set for coding a second syntax element conforming to the particular type of syntax element of a second slice of video data based on a mapping of a second slice type of the second slice of video data to the initialization value set, wherein the second slice type is different from the first slice type, and wherein at least one of the first slice type and the second slice type is a temporally predicted slice type; and
code the second syntax element using the initialization value set.

34. The non-transitory computer-readable storage medium of claim 33, further comprising instructions that cause the one or more processors to:
  determine a second initialization value set for coding a third syntax element of a third slice of video data based on an initialization indicator value for the third slice of video data; and
  code the third syntax element using the second initialization value set.

35. The non-transitory computer-readable storage medium of claim 33, further comprising instructions that cause the one or more processors to:
  determine a first mapping between one or more of the first slice type and a first initialization indicator value for the first slice of video data, and the initialization value set using a first mapping function of one or more mapping functions; and
  determine a second mapping between one or more of the second slice type and a second initialization indicator value for the second slice of video data, and the initialization value set using a second mapping function of the one or more mapping functions,
  wherein each of the first and second initialization indicator values for the first and second slices of video data indicates a particular initialization value set used to code the corresponding slice of video data.

36. The non-transitory computer-readable storage medium of claim 35, further comprising instructions that cause the one or more processors to code one or more values representative of at least one of the one or more mapping functions and the first and second initialization indicator values in at least one of a picture parameter set (PPS), a sequence parameter set (SPS), an adaptation parameter set (APS), a video parameter set (VPS), a slice header, a frame header, and a sequence header, associated with the video data.

37. The non-transitory computer-readable storage medium of claim 35, further comprising instructions that cause the one or more processors to determine at least one of the one or more mapping functions and the first and second initialization indicator values based on one or more of a quantization parameter (QP), a frame resolution parameter, and a group-of-pictures (GOP) structure parameter associated with the video data, and a user input.

38. The non-transitory computer-readable storage medium of claim 33, wherein the initialization value set comprises one of:
  a slope value and a separate intersection value; and
  a single value representing both the slope value and the intersection value.

39. A method of coding video data, the method comprising:
  determining a subset of contexts for coding a first syntax element, conforming to a particular type of syntax element, of a first slice of video data;
  selecting an initialization value set for the subset of contexts for coding the first syntax element based on a mapping of a slice type of the first slice of video data to the initialization value set, wherein selecting the initialization value set comprises determining a subset of contexts for coding the first syntax element from a full set of contexts;
  coding the first syntax element using the initialization value set;
  selecting the initialization value set for the subset of contexts for coding a second syntax element conforming to the particular type of syntax element of a second slice of video data based on a mapping of a second slice type of the second slice of video data to the initialization value set, wherein the second slice type is different from the first slice type, wherein at least one of the first slice type and the second slice type is a temporally predicted slice type, and wherein selecting the initialization value set comprises determining a subset of contexts for coding the first syntax element from a full set of contexts;
  coding the second syntax element using the initialization value set;
  determining a second initialization value set for coding a third syntax element of a third slice of video data based on an initialization indicator value for the third slice of video data; and
  coding the third syntax element using the second initialization value set.

* * * * *